United States Patent
Shigaki et al.

(10) Patent No.: US 9,087,522 B2
(45) Date of Patent: Jul. 21, 2015

(54) OPTICAL INFORMATION REPRODUCING DEVICE AND REFERENCE BEAM ADJUSTING METHOD

(71) Applicant: HITACHI-LG DATA STORAGE, INC., Tokyo (JP)

(72) Inventors: Masanobu Shigaki, Tokyo (JP); Motoyuki Suzuki, Ibaraki (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 14/461,028

(22) Filed: Aug. 15, 2014

(65) Prior Publication Data
US 2015/0078149 A1    Mar. 19, 2015

(30) Foreign Application Priority Data
Sep. 13, 2013    (JP) ................................ 2013-190001

(51) Int. Cl.
| | |
|---|---|
| G11B 7/0065 | (2006.01) |
| G11B 7/00 | (2006.01) |
| G11C 13/04 | (2006.01) |

(52) U.S. Cl.
CPC ...... G11B 7/0065 (2013.01); *G11B 2007/0009* (2013.01); *G11C 13/042* (2013.01)

(58) Field of Classification Search
None
See application file for complete search history.

(56) References Cited

U.S. PATENT DOCUMENTS

2012/0008476 A1    1/2012    Kuroda et al.

FOREIGN PATENT DOCUMENTS

WO    2011/018836 A1    2/2011

*Primary Examiner* — Wayne Young
*Assistant Examiner* — Brian Butcher
(74) *Attorney, Agent, or Firm* — McDermott Will & Emery LLP

(57) ABSTRACT

An optical information reproducing device includes: a light source that emits light to the optical information recording medium; a light source control unit that controls a wavelength of the light emitted from the light source; a reference beam angle control unit that controls an incidence angle of the reference beam to the optical information recording medium; a light detector that detects a reproduction image from the optical information recording medium or a brightness distribution of the reproduction image; a reproduction image processing unit that detects a bright line of the reproduction image on the basis of a detection result of the light detector and outputs a detection result of the bright line; and a controller that controls the wavelength of the light emitted from the light source, on the basis of an output of the reproduction image processing unit, and controls the incidence angle of the reference beam.

13 Claims, 20 Drawing Sheets

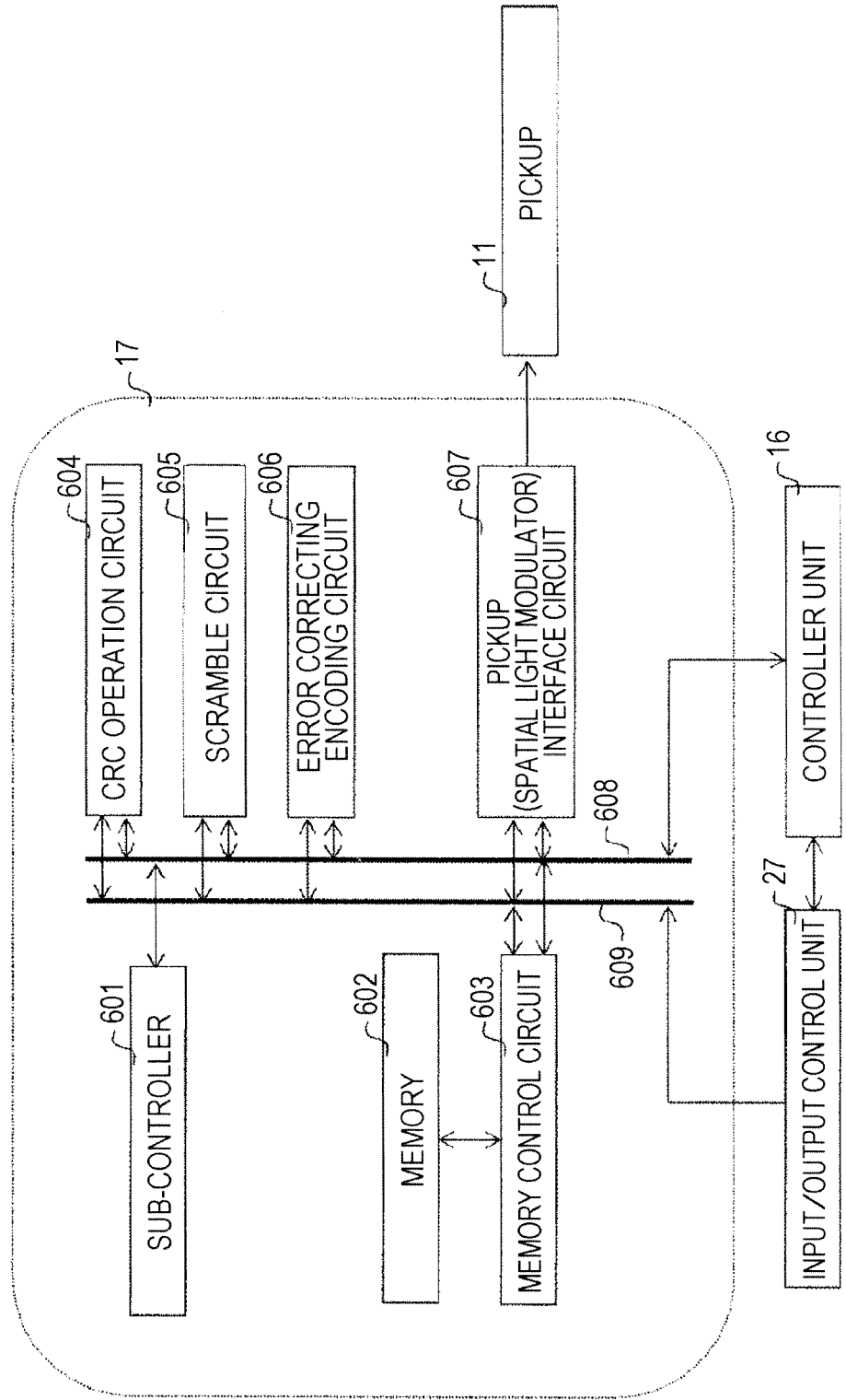

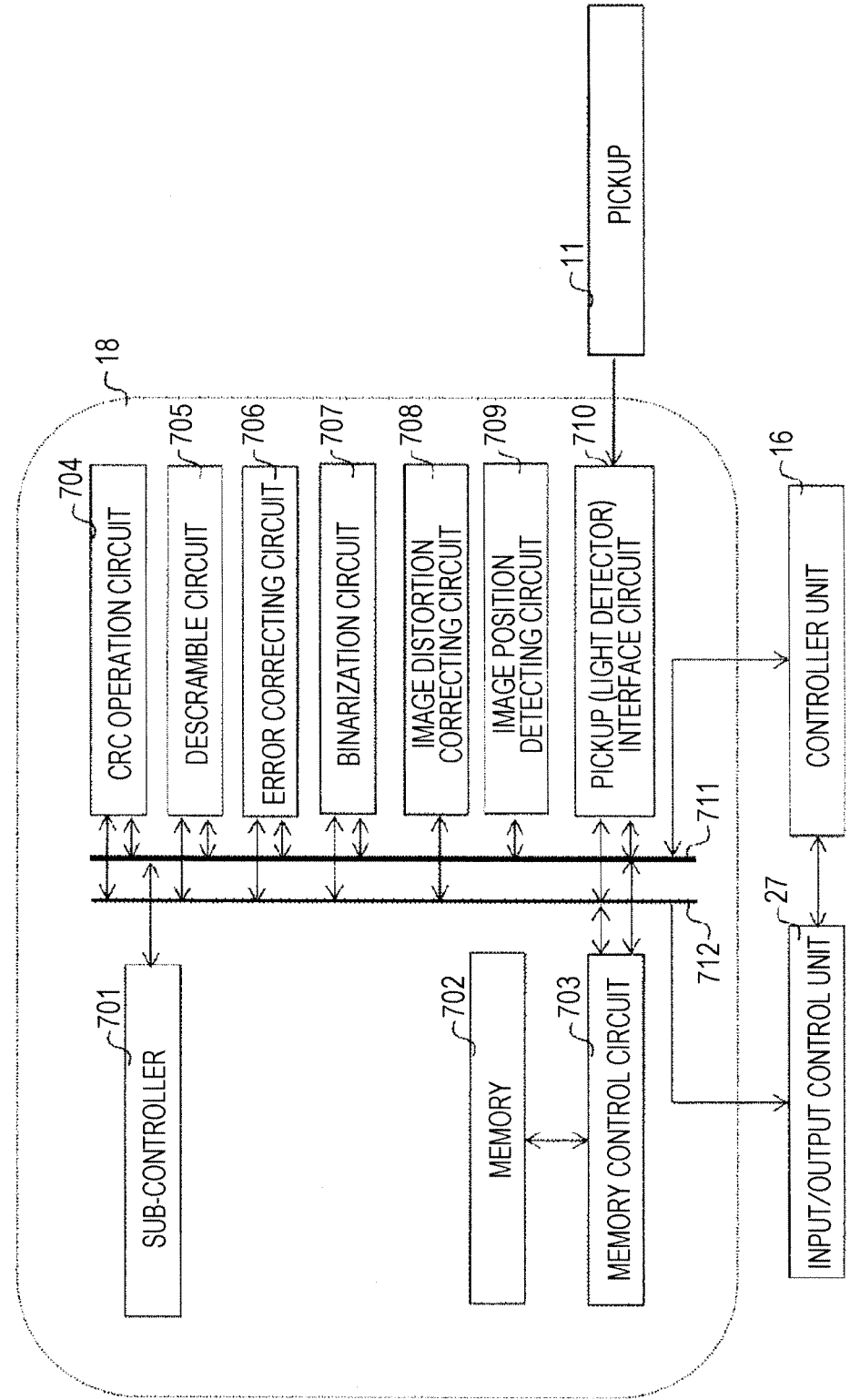

BRIGHT LINE ANGLE
$\alpha < 0$

BRIGHT LINE ANGLE
$\alpha \approx 0$

BRIGHT LINE ANGLE
$\alpha > 0$

METHOD OF CALCULATING BRIGHT LINE ANGLE $\alpha$
WHEN BRIGHT LINE BECOMES CIRCULAR ARC FIG. 15A  FIG. 15B  FIG. 15C
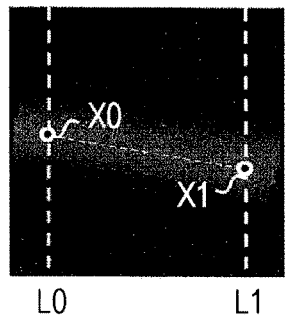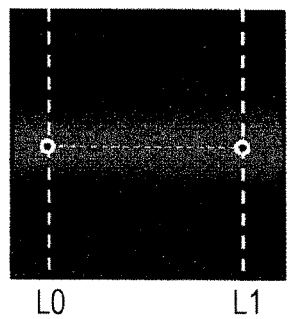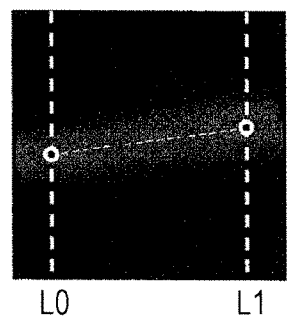
FIG. 16A  FIG. 16B  FIG. 16C
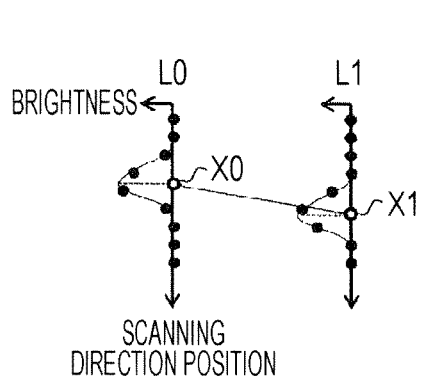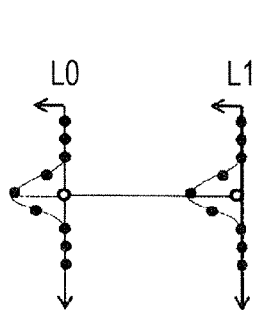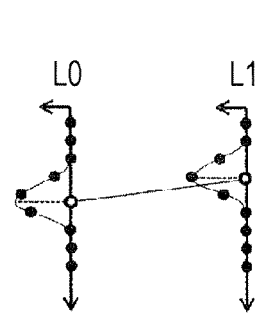
BRIGHT LINE POSITION ERROR $B_E < 0$
BRIGHT LINE POSITION ERROR $B_E \approx 0$
BRIGHT LINE POSITION ERROR $B_E > 0$

OPTICAL INFORMATION REPRODUCING DEVICE AND REFERENCE BEAM ADJUSTING METHOD

CROSS-REFERENCE TO RELATED APPLICATIONS

This application claims the priority of Japanese Patent Application No. 2013-190001, filed on Sep. 13, 2013, which is incorporated herein by reference in its entirety.

BACKGROUND OF THE INVENTION

1. Field of the Invention

The present invention relates to an optical information reproducing device to reproduce information recorded on an optical information recording medium using interference of a signal beam and a reference beam and a reference beam adjusting method.

2. Description of the Related Art

Hologram recording technology for recording digital information using holography has attracted attention during making a study of next-generation storage technology.

The hologram recording technology is technology for overlapping a signal beam having information of page data modulated two-dimensionally by a spatial light modulator to a reference beam in a recording medium, generating refractive index modulation in the recording medium by a fringe pattern generated at that time, and recording information on the recording medium.

At the time of reproducing information, if the recording medium is irradiated with the reference beam used at the time of recording, a hologram recorded on the recording medium acts like a diffraction grating to generate diffracted light. The diffracted light is reproduced as the same light as the recorded signal beam, including phase information.

The reproduced signal beam is detected two-dimensionally using a light detector such as a CMOS or a CCD. As such, the hologram recording technology enables two-dimensional information to be recorded/reproduced on the optical recording medium at one time by one hologram and enables a plurality of page data to be overwritten to the same place of the recording medium by changing an angle of the reference beam radiated to the recording medium at the time of recording, thereby enabling large-capacity and high-speed information to be recorded/reproduced.

In the reproduction of the hologram, if the recording medium is contracted/expanded according to a temperature, an angle and an interval of a grating recorded as the diffraction grating change, so that a signal quality of reproduction light is deteriorated. In order to compensate for the deterioration in the signal quality, it is necessary to adjust an incidence angle and a wavelength of the reference beam radiated to the recording medium. A method of detecting a characteristic of the reproduction light and adjusting the incidence angle and the wavelength of the reference beam has been suggested (for example, refer to WO 2011/018836 A).

SUMMARY OF THE INVENTION

In the method disclosed in WO 2011/018836 A, the radiation angle and the wavelength of the reference beam are individually adjusted and a step of performing feedback control on the radiation angle of the reference beam and adjusting the radiation angle and a step of performing the feedback control on the wavelength and adjusting the wavelength are included. In addition, in a hologram recording/reproducing device, an external cavity laser diode (ECLD) having an external resonator with a variable wavelength is used as a light source of the reference beam. When the wavelength changes, it takes several seconds to stabilize the wavelength. For this reason, when the feedback control is performed on the wavelength, the feedback control needs to be performed in a low control band of 1 Hz or less and it takes a long time to converge light of the wavelength.

An object of the present invention is to provide an optical information reproducing device and a reference beam adjusting method that can adjust an angle of a reference beam and a wavelength of the reference beam in short time.

In order to resolve the above-described problems, for example, configurations described in claims may be adopted. For example, the above object can be achieved by including: a light source that emits light to the optical information recording medium; a light source control unit that controls a wavelength of the light emitted from the light source; a reference beam angle control unit that controls an incidence angle of the reference beam to the optical information recording medium; a light detector that detects a reproduction image from the optical information recording medium or a brightness distribution of the reproduction image; a reproduction image processing unit that detects a bright line of the reproduction image on the basis of a detection result of the light detector and outputs a detection result of the bright line; and a control unit that controls the wavelength of the light emitted from the light source through the light source control unit, on the basis of an output of the reproduction image processing unit, and controls the incidence angle of the reference beam through the reference beam angle control unit.

According to the present invention, an optical information reproducing device and a reference beam adjusting method that can adjust an angle of a reference beam and a wavelength of the reference beam in short time can be provided.

BRIEF DESCRIPTION OF THE DRAWINGS

FIG. 6 is a block diagram illustrating an embodiment of a signal generating unit in an optical information recording/reproducing device according to the present invention;

FIG. 7 is a block diagram illustrating an embodiment of a signal processing unit in an optical information recording/reproducing device according to the present invention;

FIGS. 15A to 15C are diagrams illustrating examples of a relation of a reproduction image on a light detector and a brightness scanning line position;

FIGS. 16A to 16C are diagrams illustrating examples of a relation of a position of a scanning direction and brightness;

DESCRIPTION OF THE PREFERRED EMBODIMENTS

Hereinafter, embodiments of the present invention will be described using the drawings.

First Embodiment

Figure 1:
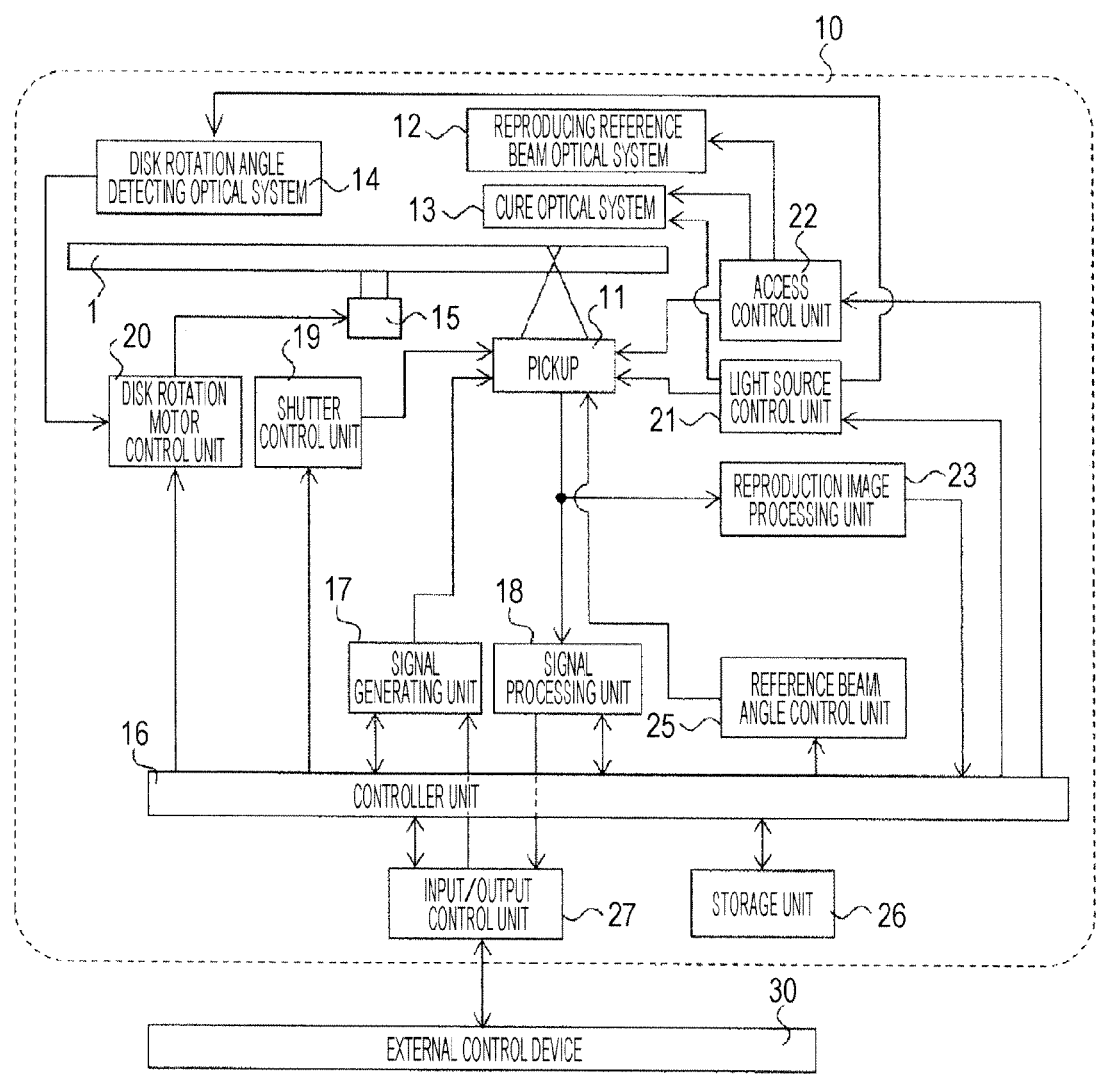
FIG. 1 is a block diagram illustrating a configuration example of an optical information recording/reproducing device according to the present invention.

Embodiments of the present invention will be described with reference to the accompanying drawings. FIG. 1 is a block diagram illustrating an example of a recording/reproducing device of an optical information recording medium that records/reproduces digital information using holography.

An optical information recording/reproducing device 10 is connected to an external control device 30 through an input/output control unit 27. When recording is performed, the optical information recording/reproducing device 10 receives a recorded information signal from the external control device 30 by the input/output control unit 27. When reproduction is performed, the optical information recording/reproducing device 10 transmits the reproduced information signal to the external control device 30 by the input/output control unit 27.

The optical information recording/reproducing device 10 includes a pickup 11, a reproducing reference beam optical system 12, a cure optical system 13, a disk rotation angle detecting optical system 14, and a rotation motor 15 and an optical information recording medium 1 is rotatable by the rotation motor 15. A controller unit 16 is configured with a central processing unit (CPU). The controller unit 16 exchanges a signal with individual units configuring the optical information recording/reproducing device 10, according to a program or data stored in a storage unit 26, and wholly controls the optical information recording/reproducing device 10.

The pickup 11 performs a function of radiating a reference beam and a signal beam to the optical information recording medium 1 and recording digital information using holography. At this time, the recorded information signal is transmitted to a spatial light modulator to be described below in the pickup 11 through a signal generating unit 17 by the controller unit 16 and the signal beam is modulated by the spatial light modulator.

When the information recorded on the optical information recording medium 1 is reproduced, a light wave to cause the reference beam emitted from the pickup 11 to be incident on the optical information recording medium in a direction opposite to an incidence direction at the time of recording is generated by the reproducing reference beam optical system 12. Reproduction light reproduced by the reproducing reference beam is detected by the light detector to be described below in the pickup 11 and a signal is reproduced by the signal processing unit 18. In addition, an output of the light detector is also input to the reproduction image processing unit 23 and a processing result corresponding to the reproduction image on the light detector or a brightness distribution of the reproduction image is output to the controller unit 16. A place where a portion having high brightness in the reproduction image is linear is defined as a bright line. In this embodiment, the case in which a bright line angle formed by a bright line of the reproduction image when an incidence angle of the reference beam and the wavelength of the wavelength variable light source are optimal and a bright line of the reproduction image on the light detector is detected in the reproduction image processing unit 23 will be described.

In the controller unit 16, a deviation of the incidence angle of the reference beam to the optical information recording medium 1 and a deviation of the wavelength of the reference beam are detected on the basis of the bright line angle of the reproduction image. In the controller unit 16, a mechanism provided in the optical pickup 11 is controlled by the reference beam angle control unit 25, so that the incidence angle of the reference beam to the optical information recording medium 1 is adjusted and the wavelength of the light source of the reference beam mounted to the optical pickup 11 is adjusted by the light source control unit 21.

The shutter control unit 19 controls an opening/closing time of a shutter in the pickup 11, on the basis of a command from the controller unit 16, to adjust radiation times of the reference beam and the signal beam radiated to the optical information recording medium 1 at the time of recording.

The cure optical system 13 performs a function of generating light beams used for precure and postcure of the optical information recording medium 1. The precure is a preprocess for radiating a predetermined light beam in advance before radiating the reference beam and the signal beam to a desired position, when information is recorded on the desired position in the optical information recording medium 1. The postcure is a postprocess for radiating a predetermined light beam to disable additional recording on the desired position, after the information is recorded on the desired position in the optical information recording medium 1.

The disk rotation angle detecting optical system 14 is used to detect a rotation angle of the optical information recording medium 1. When the rotation angle of the optical information recording medium 1 is adjusted to a predetermined rotation angle, a signal according to the rotation angle is detected by the disk rotation angle detecting optical system 14 and the disk rotation motor control unit 20 performs control using the detected signal, such that the rotation angle of the optical information recording medium 1 becomes the rotation angle commanded by the controller unit 16.

In the light source control unit 21, each of the light sources of the signal beam and the reference beam mounted to the pickup 11 is driven to emit a light beam at a predetermined light amount and a predetermined wavelength and each of the light sources in the cure optical system 13 and the disk rotation angle detecting optical system 14 is driven to emit a light beam at a predetermined light amount.

In addition, in the pickup 11 and the cure optical system 13, mechanisms (not illustrated in the drawings) for enabling sliding in a radial direction of the optical information recording medium 1 are provided and position control is performed through the access control unit 22.

Figure 2:
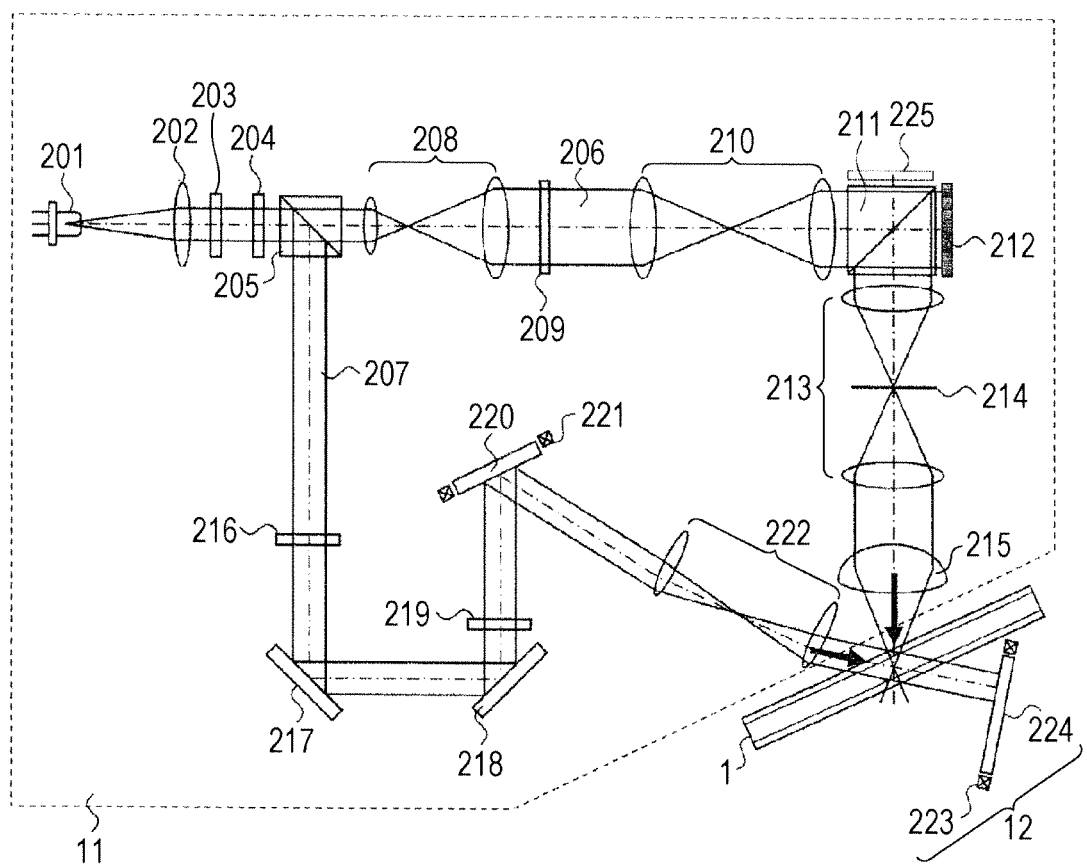
FIG. 2 is a diagram illustrating a recording principle in a configuration example of a pickup in an optical information recording/reproducing device according to the present invention.

FIG. 2 illustrates a recording principle in an example of a basic optical system configuration of the pickup 11 in the optical information recording/reproducing device 10. A light source 201 is a laser diode having an external resonator with a variable wavelength and is driven by the light source control unit 21 to emit a laser beam at a predetermined light amount and a predetermined wavelength according to a command from the controller unit 16. The light beam emitted from the light source 201 transmits a collimate lens 202 and is incident on a shutter 203. When the shutter 203 is opened, after the light beam passes through the shutter 203, a polarization direction of the light beam is controlled such that a light amount ratio of p polarized light and s polarized light becomes a desired ratio by an optical element 204 configured with a ½ wavelength plate. Then, the light beam is incident on a polarization beam splitter (PBS) prism 205.

The light beam having transmitted the PBS prism 205 functions as a signal beam 206 and a light beam diameter thereof is increased by a beam expander 208. Then, the light beam transmits a phase mask 209, a relay lens 210, and a PBS prism 211 and is incident on a spatial light modulator 212.

The signal beam to which information has been added by the spatial light modulator 212 is reflected on the PBS prism 211 and propagates through a relay lens 213 and a spatial filter 214. Then, the signal beam is condensed on the optical information recording medium 1 by an objective lens 215.

Meanwhile, the light beam having reflected on the PBS prism 205 functions as a reference beam 207 and a polarization direction thereof is set to a predetermined polarization direction according to a recording mode or a reproduction mode, by a polarization direction converting element 216. Then, the light beam is reflected on mirrors 217 and 218 and is incident on an angle correcting element 219. The angle correcting element 219 is a mechanism for rotating a wedge prism and is an element to correct an angle of a direction almost vertical to an angle multiple recording direction in the optical information recording medium 1. Here, an angle of an angle multiple direction is set as an angle $\theta_B$ on bragg direction and an angle of a direction almost vertical to the angle on bragg direction is set as an angle $\theta_P$ on pitch direction. The light beam emitted from the angle correcting element 219 is incident on a galvano-mirror 220. The galvano-mirror 220 can adjust the angle $\theta_B$ on bragg direction by an actuator 221. As such, the angle correcting element 219 and the galvano-mirror 220 operate as a mechanism for correcting an incidence angle of the reference beam on the optical information recording medium 1 and can set the incidence angle $\theta_B$ on bragg direction and the incidence angle $\theta_P$ on pitch direction in the reference beam incident on the optical information recording medium 1 after passing through a scanner lens 222, to desired angles.

By the operation described above, the signal beam and the reference beam are made to be incident to overlap each other in the optical information recording medium 1 to form a fringe pattern in the recording medium and information is recorded by writing the pattern to the recording medium. In addition, because the angle $\theta_B$ on bragg direction in the reference beam incident on the optical information recording medium 1 can be changed by the galvano-mirror 220, angle multiple recording is enabled.

Hereinafter, holograms corresponding to individual reference beam angles in holograms recorded by changing the incidence angle $\theta_B$ on bragg direction in the reference beam in the same region are called pages and a set of pages subjected to angle multiple recording in the same region is called a book.

Figure 3:
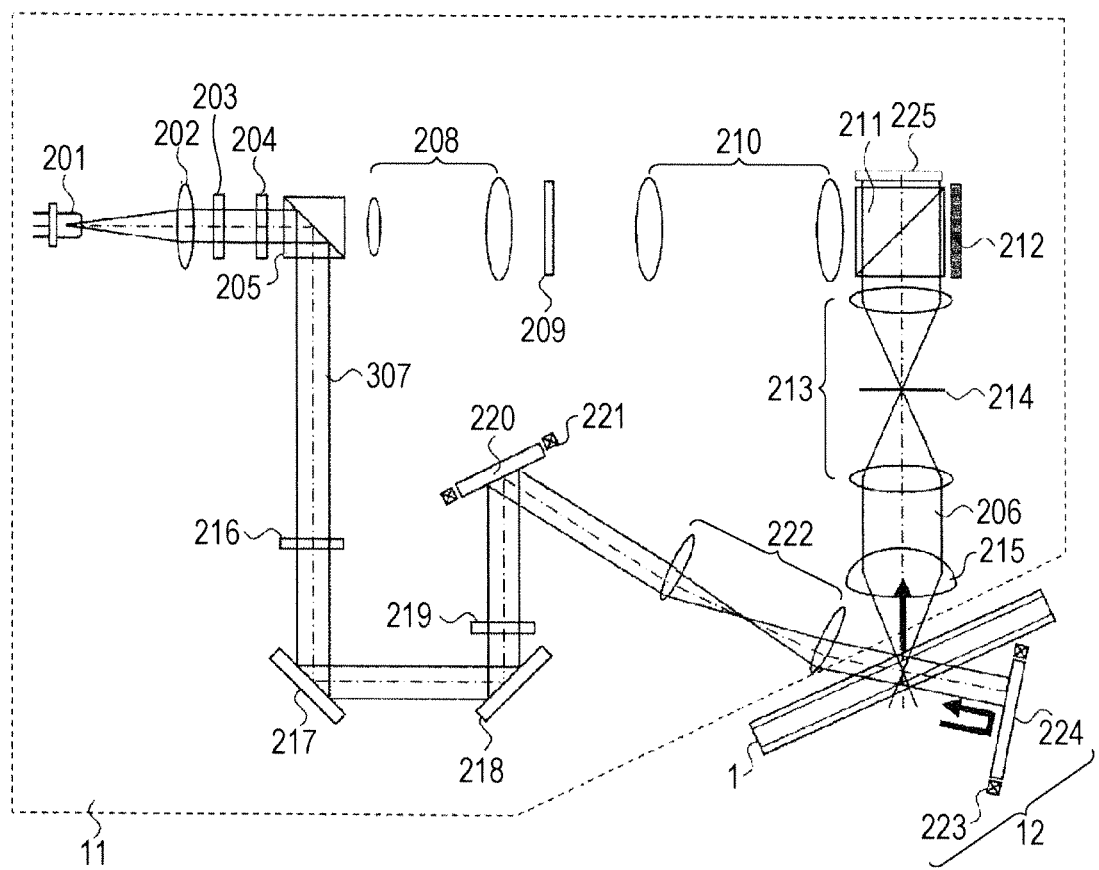
FIG. 3 is a diagram illustrating a reproduction principle in a configuration example of a pickup in an optical information recording/reproducing device according to the present invention.

FIG. 3 illustrates a reproduction principle in an example of a basic optical system configuration of the pickup 11 in the optical information recording/reproducing device 10. When recorded information is reproduced, as described above, the reference beam is incident on the optical information recording medium 1, the light beam having transmitted the optical information recording medium 1 is reflected by a galvano-mirror 224 of which an angle can be adjusted by the actuator 223, and the reference beam for the reproduction is generated.

The reproduction light reproduced by the reference beam for the reproduction propagates through the objective lens 215, the relay lens 213, and the spatial filter 214. Then, the reproduction light transmits the PBS prism 211, is incident on a light detector 225, and can reproduce a recorded signal. As the light detector 225, an imaging element such as a CMOS image sensor or a CCD image sensor can be used. However, if page data can be reproduced, any element may be used.

As described above, in reproduction of the hologram, if the optical information recording medium 1 is contracted/expanded according to the temperature, a quality of the reproduced signal beam is deteriorated. In addition, in recording technology using an angle multiple principle of holography, an allowance error with respect to a deviation of a reference beam angle tends to greatly decrease and a deviation of an angle of the reference beam radiated to the optical information recording medium 1 by a mounting error of the mechanism such as the disk rotation motor 15 or the pickup 11 greatly affects the quality of the signal beam. For this reason, it is necessary to adjust the angle and the wavelength of the reference beam radiated to the recording medium with respect to a deviation of the temperature with the temperature at the time of recording of the optical information recording medium 1 and a mounting error of a mechanism for each device, at the time of reproduction.

Figure 4A:
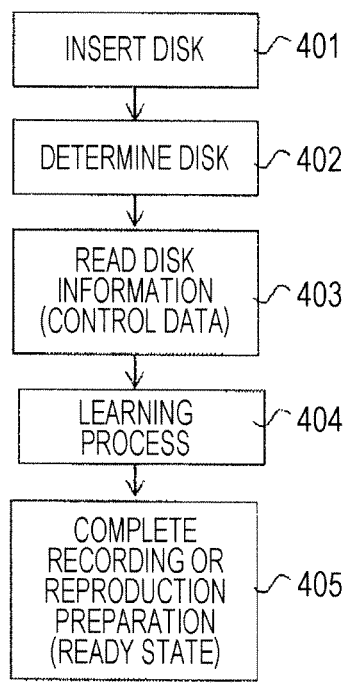
FIGS. 4A to 4C are flowcharts illustrating an embodiment of an operation in an optical information recording/reproducing device according to the present invention.
Figure 4B:
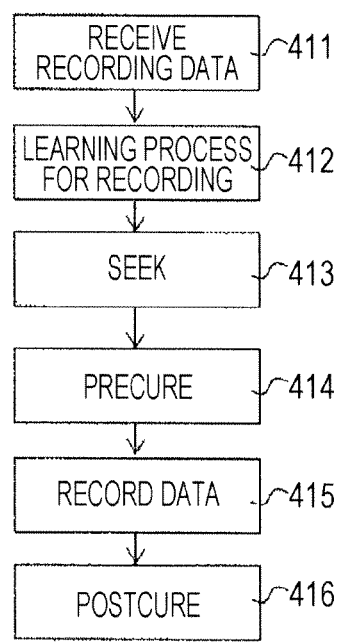
Figure 4C:
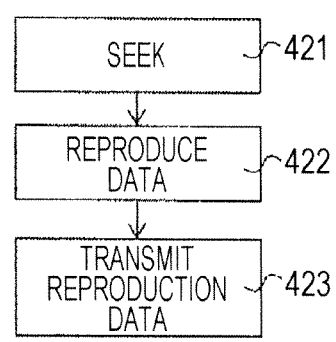

FIGS. 4A to 4C illustrate operation flows of recording and reproduction in the optical information recording/reproducing device 10. Here, flows regarding recording/reproduction using holography in particular will be described.

FIG. 4A illustrates an operation flow until a preparation for recording or reproduction is completed after the optical information recording medium 1 is inserted into the optical information recording/reproducing device 10, FIG. 4B illustrates an operation flow until information is recorded on the optical information recording medium 1 after the preparation is completed, and FIG. 4C illustrates an operation flow until the information recorded on the optical information recording medium 1 is reproduced after the preparation is completed.

As illustrated in FIG. 4A, if the medium is inserted (401), the optical information recording/reproducing device 10 performs a disk determination on whether the inserted medium is an optical information recording medium recording or reproducing digital information using holography (402).

As a result of the disk determination, when it is determined that the inserted medium is the optical information recording medium recording or reproducing the digital information using the holography, the optical information recording/reproducing device 10 reads control data recorded on the optical information recording medium (403) and acquires information regarding the optical information recording medium or information regarding various setting conditions at the time of recording or reproduction.

After the control data is read, various adjustments according to the control data or a learning process (404) regarding the pickup 11 is executed and the optical information recording/reproducing device 10 completes the preparation for the recording or reproduction (405).

In the operation flow until the information is recorded after the preparation is completed, as illustrated in FIG. 4(B), first, data to be recorded is received (411) and information according to the data is transmitted to the spatial light modulator in the pickup 11.

Then, various learning processes for recording such as power optimization of the light source 201 or optimization of an exposure time by the shutter 203 are executed in advance according to necessity, such that information of a high quality can be recorded on the optical information recording medium (412).

Then, in a seek operation (413), the access control unit 22 is controlled and a position of each of the pickup 11 and the cure optical system 13 is arranged to a predetermined position of the optical information recording medium. When the optical information recording medium 1 has address information, the address information is reproduced and it is confirmed whether the position is arranged to a target position. When the position is not arranged to the target position, an operation for calculating a deviation amount with the predetermined position and arranging the position again is repeated.

Then, the precure of a predetermined region is performed by using the light beam emitted from the cure optical system 13 (414) and data is recorded using the reference beam and the signal beam emitted from the pickup 11 (415).

After the data is recorded, the postcure is performed using the light beam emitted from the cure optical system 13 (416). According to the necessity, the data may be verified.

In the operation flow until the recorded information is reproduced after the preparation is completed, as illustrated in FIG. 4C, first, in the seek operation (421), the access control unit 22 is controlled and a position of each of the pickup 11 and the reproducing reference beam optical system 12 is arranged to a predetermined position of the optical information recording medium. When the optical information recording medium 1 has address information, the address information is reproduced and it is confirmed whether the position is arranged to a target position. When the position is not arranged to the target position, an operation for calculating a deviation amount with the predetermined position and arranging the position again is repeated.

Then, the reference beam is emitted from the pickup 11, the information recorded on the optical information recording medium is read (422), and the reproduction data is transmitted (423).

Figure 5A:
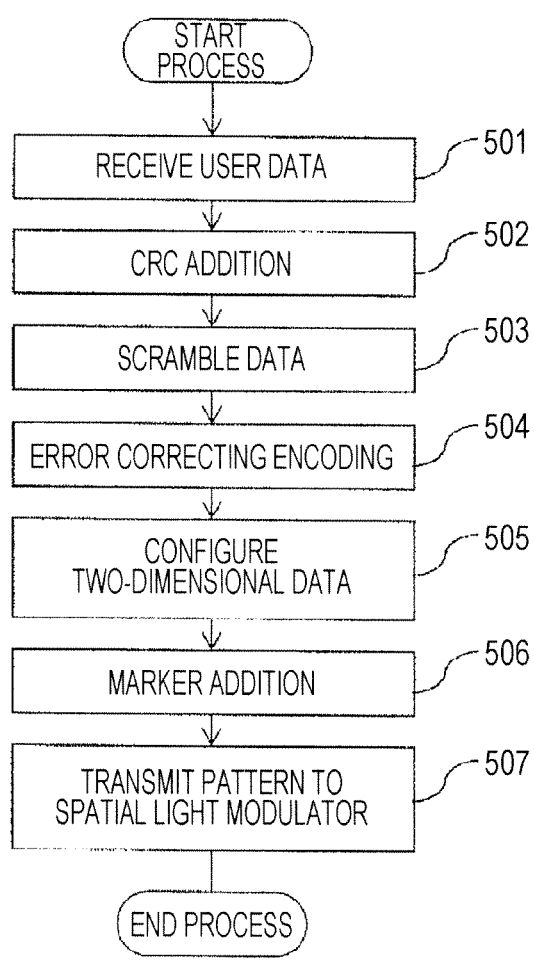
FIGS. 5A and 5B are flowcharts illustrating an embodiment of operations in a signal generating unit and a signal processing unit.
Figure 5B:
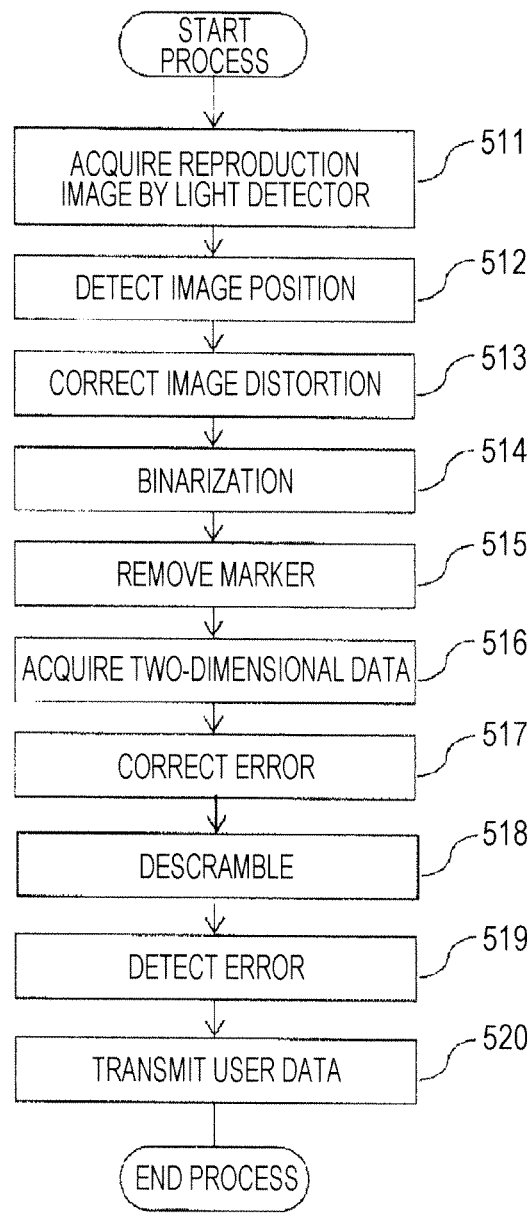

FIGS. 5A and 5B illustrate data process flows at the time of recording/reproduction. FIG. 5A illustrates a recording data process flow in the signal generating unit 17 until recording data is converted into two-dimensional data on the spatial light modulator 212, after the recording data is received in the input/output control unit 27 (411). FIG. 5B illustrates a reproduction data process flow in the signal processing unit 18 until reproduction data is transmitted in the input/output control unit 27 (423), after the two-dimensional data is detected by the light detector 225.

A data process at the time of recording will be described using FIG. 5A. If user data is received (501), the user data is divided into a plurality of data strings, each data string is subjected to CRC such that error detection is performed at the time of reproduction (502), an on-pixel number and an off-pixel number are substantially equalized to each other, scramble (503) to add a pseudo random number data string to a data string is performed to prevent the same pattern from being repeated, and error correcting encoding (504) such as a Reed-Solomon code is performed such that error correction is performed at the time of reproduction. Next, the data string is converted into two-dimensional data of M×N, the data is repeated by one page data, and two-dimensional data (505) corresponding to one page is configured. A marker becoming a basis in image position detection or image distortion correction at the time of reproduction is added to the two-dimensional data configured as described above (506) and data is transmitted to the spatial light modulator 212 (507).

Next, the data process flow at the time of reproduction will be described using FIG. 5B. The image data detected by the light detector 225 is transmitted to the signal processing unit 18 (511). The image position is detected on the basis of the marker included in the image data (512) and the inclination, the magnification, and the distortion of the image are corrected (513), a binarization process (514) is executed, the marker is removed (515), and two-dimensional data corresponding to one page is acquired (516). After the two-dimensional data obtained as described above is converted into the plurality of data strings, an error correcting process (517) is executed, and a parity data string is removed. Next, a descramble process (518) is executed, an error detection process (519) by the CRC is executed, a CRC parity is deleted, and the user data is transmitted through the input/output control unit 27 (520).

FIG. 6 is a block diagram of the signal generating unit 17 of the optical information recording/reproducing device 10.

If the user data starts to be input to the input/output control unit 27, the input/output control unit 27 notifies the controller unit 16 that the user data starts to be input. The controller unit 16 receives the notification and commands the signal generating unit 17 to execute a recording process on data corresponding to one page input from the input/output control unit 27. The process command from the controller unit 16 is notified to a subcontroller 601 in the signal generating unit 17 through a control line 608. The subcontroller 601 receives the notification and performs control of each signal processing circuit through the control line 608 to operate each signal processing circuit in parallel. First, the subcontroller 601 performs control such that a memory control circuit 603 stores user data input from the input/output control unit 27 through a data line 609 in a memory 602. If an amount of the user data stored in the memory 602 reaches a constant amount, the subcontroller 601 performs control to subject the user data to the CRC by a CRC operation circuit 604. Next, the subcontroller 601 performs scramble to add the pseudo random number data string to the data subjected to the CRC by a scramble circuit 605 and performs control to perform error correcting encoding adding the parity data string by the error correcting encoding circuit 606. Finally, the subcontroller 601 reads error correcting encoding data from the memory 602 to a pickup interface circuit 607 in arrangement order of the two-dimensional data on the spatial light modulator 212, adds the marker becoming the basis at the time of reproduction, and transmits the two-dimensional data to the spatial light modulator 212 in the pickup 11.

FIG. 7 is a block diagram of the signal processing unit 18 of the optical information recording/reproducing device 10.

If the light detector 225 in the pickup 11 detects image data, the controller unit 16 commands the signal processing unit 18 to execute a reproduction process on data corresponding to one page input from the pickup 11. The process command from the controller unit 16 is notified to a subcontroller 701 in the signal processing unit 18 through a control line 711. The subcontroller 701 receives the notification and performs control of each signal processing circuit through the control line 711 to operate each signal processing circuit in parallel. First, the subcontroller 701 performs control such that a memory control circuit 703 stores image data input from the pickup 11 through a data line 712 via a pickup interface circuit 710 in a memory 702. If an amount of the data stored in the memory 702 reaches a constant amount, the subcontroller 701 performs control to detect the marker from the image data stored in the memory 702 by the image position detecting circuit 709 and extract a valid data range. Next, the subcontroller 701 performs control to correct the inclination, the magnification, and the distortion of the image by an image distortion correcting circuit 708 using the detected marker and convert a size of the image data into a size of two-dimensional data to be expected. The subcontroller 701 performs control to binarize each bit data of a plurality of bits configuring the size converted two-dimensional data to determine each bit data as "0" or "1" in a binarization circuit 707 and store data in arrangement order of outputs of the reproduction data on the memory 702. Next, the subcontroller 701 corrects an error included in each data string by an error correcting circuit 706, descrambles the scramble to add the pseudo random number data string by a descramble circuit 705, and checks whether an error is not included in the user data on the memory 702, by a CRC operation circuit 704. Then, the subcontroller 701 transmits the user data from the memory 702 to the input/output control circuit 70.

A method of adjusting an angle and a wavelength of the reference beam at the time of reproduction will be described in detail with reference to FIGS. 8 to 13. That is, FIGS. 8 to 13 illustrate the detail of the data reproduction process (422) described in FIG. 4C.

Figure 8:
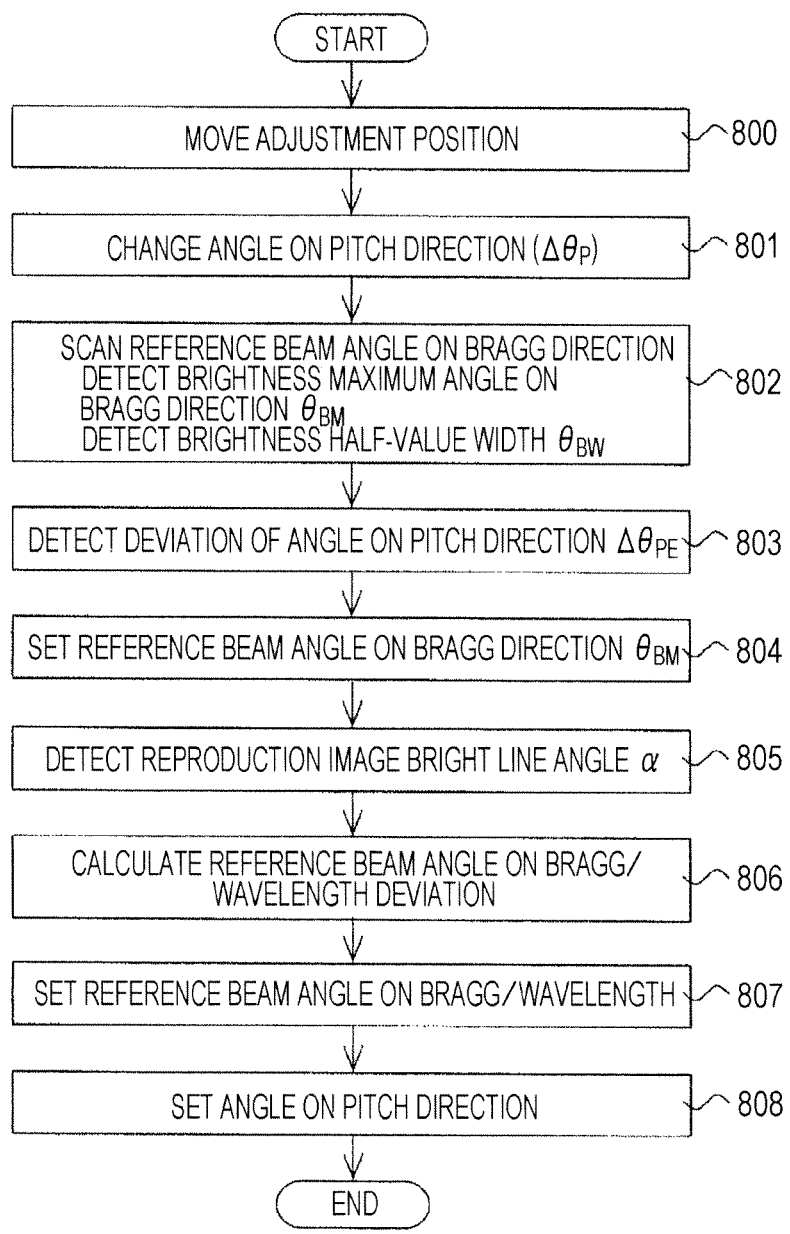
FIG. 8 is a flowchart illustrating an example of a reference beam angle and wavelength adjustment process.

FIG. 8 illustrates an example of a flowchart of a process for adjusting an angle and a wavelength of the reference beam.

In FIG. 8, first, the access control unit 22 is controlled according to a command from the controller unit 16, the seek operation is performed, and the position of each of the pickup 11 and the reproducing reference beam optical system 12 is arranged to the predetermined position of the optical information recording medium 1 (800).

In 801, the angle correcting element 219 is controlled according to the command from the controller unit 16 to the reference beam angle control unit 25 and an angle on pitch direction in the reference beam incident on the optical information recording medium 1 is changed by $\Delta\theta_P$.

Figure 9:
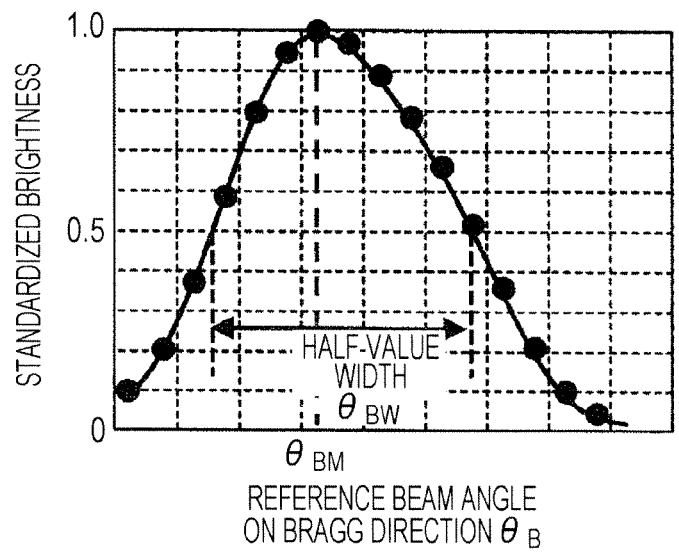
FIG. 9 is an exemplary graph illustrating a relation of a reference beam angle on bragg direction and reproduction light brightness.

In 802, the galvano-mirror 220 is controlled according to the command from the controller unit 16 to the reference beam angle control unit 25 and the brightness of the reproduction light detected by the reproduction image processing unit 23 is measured while an angle $\theta_B$ on bragg direction in the reference beam incident on the optical information recording medium 1 is changed. Thereby, the relation of the angle $\theta_B$ on bragg direction and the brightness of the reproduction light, illustrated in FIG. 9, is obtained and an angle $\theta_{BM}$ on bragg direction at which the brightness of the reproduction light is maximized and a half-value width $\theta_{BW}$ of the reference beam angle on bragg direction at which the brightness becomes half the maximum brightness are detected.

In 803, a deviation $\Delta\theta_{PE}$ from an optimal reference beam angle on pitch direction is calculated from the half-value width $\theta_{BW}$ of the reference beam angle on bragg direction, detected by 802.

In 804, the galvano-mirror 220 is controlled according to the command from the controller unit 16 to the reference beam angle control unit 25 and the angle $\theta_B$ on bragg direction in the reference beam incident on the optical information recording medium 1 is set to the angle $\theta_{BM}$ at which the brightness of the reproduction light is maximized, detected by 802.

In 805, the inclination of the bright line of the reproduction image is detected by the reproduction image processing unit 23.

In 806, deviation amounts from optimal values of the reference beam angle on bragg and the reference beam wavelength are calculated from the pitch direction angle deviation $\Delta\theta_{PE}$ detected by 803 and the bright line angle α of the reproduction image detected by 805.

In 807, the galvano-mirror 220 and the light source 201 are controlled according to the commands from the controller unit 16 to the reference beam angle control unit 25 and the light source control unit 21 and the reference beam angle on bragg and the reference beam wavelength are set to correct the deviation amounts $\Delta\theta_{BE}$ and $\Delta\pi_E$ of the reference beam angle on bragg and the reference beam wavelength calculated by 806.

In 808, the angle correcting element 219 is controlled according to the command from the controller unit 16 to the reference beam angle control unit 25, the angle on pitch direction is set to correct the deviation $\Delta\theta_{PE}$ of the angle on pitch direction, which is detected by 803, and an adjustment process ends.

By the process described above, the reference beam angle on pitch direction, the reference beam angle on bragg direction, the reference beam wavelength are set in a state in which information can be reproduced.

Next, a method of calculating the deviation $\Delta\theta_{PE}$ from the optimal reference beam angle on pitch direction from the half-value width $\theta_{BW}$ of the reference beam angle on bragg direction in the process of 803 will be described.

Figure 10:
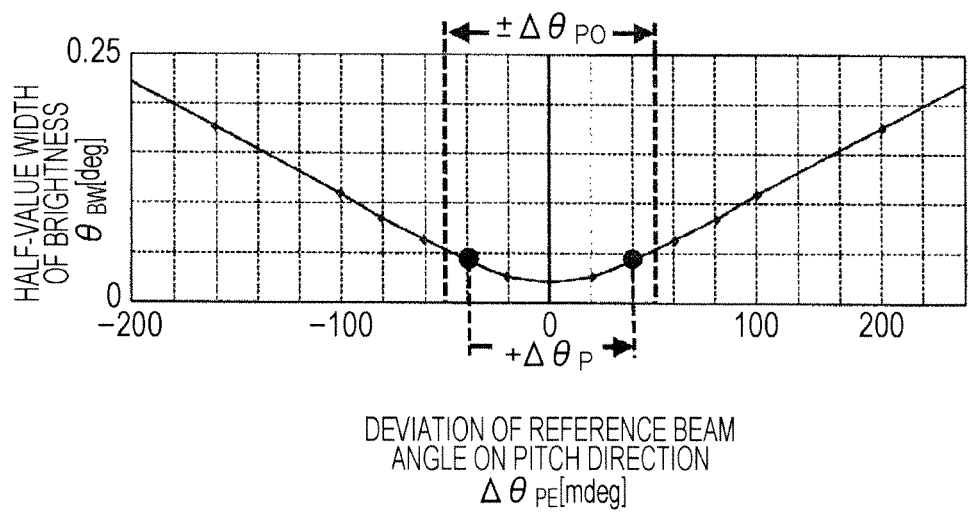
FIG. 10 is an exemplary graph illustrating a relation of a deviation of a reference beam angle on pitch direction and a brightness half-value width of a reference beam angle on bragg direction.

The width of the reference beam angle on bragg direction at which the brightness becomes a predetermined level or more depends on the magnitude (absolute value) of the deviation $\Delta\theta_{PE}$ from the optimal pitch direction angle. For example, the half-value width $\theta_{BW}$ of the reference beam angle on bragg direction with respect to the magnitude of the pitch direction angle deviation $\Delta\theta_{PE}$ becomes almost a linear relation as illustrated in FIG. 10. Therefore, the magnitude of the deviation $\Delta\theta_{PE}$ from the optimal reference beam angle on pitch direction can be calculated from the half-value width $\theta_{BW}$ of the bright reference beam angle on bragg direction.

For example, when the variation of the reference beam angle on pitch direction by the mounting error of the mechanism for each device such as the disk rotation motor 15 or the pickup 11 is set to $\pm\Delta\theta_{PO}$, a change amount $\Delta\theta_P$ of the angle on pitch direction in 801 is set to $\Delta\theta_P > \Delta\theta_{po}$. Thereby, an angle $\theta_P$ on pitch direction after the angle on pitch direction is changed has a mark corresponding to the change amount $\Delta\theta_P$ of the angle on pitch direction and the magnitude and the polarity of the deviation $\Delta\theta_{PE}$ from the optimal angle on pitch direction can be detected from the half-value width $\theta_{BW}$ of the reference beam angle on bragg direction.

In general, because the disk-shaped optical information recording medium 1 is mounted to the disk rotation motor 15 at the inner circumference position, the variation of the angle on pitch direction at the outer circumference is more than that at the inner circumference. Therefore, first, in the process for adjusting the angle and the wavelength of the reference beam, it is preferable to execute the process after moving the position to the adjustment position of the inner circumference of the optical information recording medium 1 by 800.

Next, a method of calculating deviation amounts from optimal values of the reference beam angle on bragg and the reference beam wavelength in 806 will be described using FIGS. 11 to 13.

Figure 11:
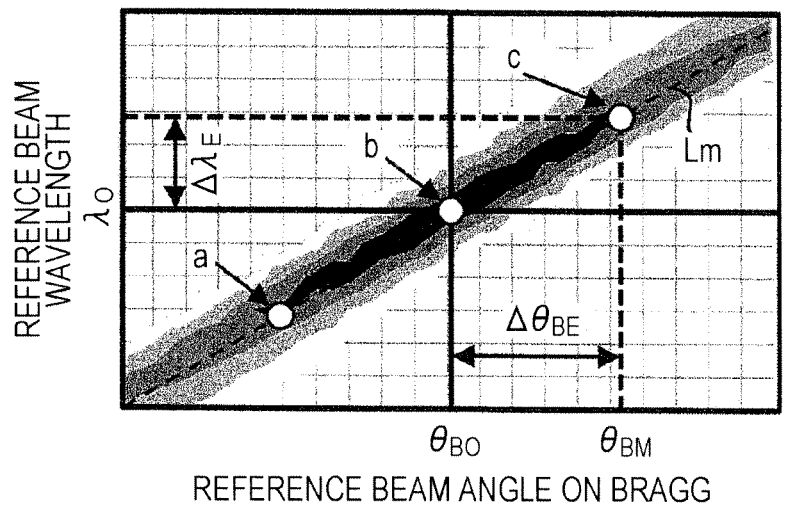
FIG. 11 is an exemplary graph illustrating a relation of brightness of reproduction light and a reference beam angle on bragg and a reference beam wavelength.

FIG. 11 illustrates an example of a relation of brightness of the reproduction light and the reference beam angle on bragg and the reference beam wavelength by a shaded contour. In the contour of FIG. 11, when a color of a region is dark, the brightness increases. For example, when a wavelength of the reference beam is deviated from the optimal wavelength $\lambda_O$ by $\Delta\lambda_E$, the brightness of the reproduction light is maximized at a point c of an angle $\theta_{BM}$ deviated from an optical reference beam angle $\theta_{BO}$ on bragg by $\Delta\theta_{BE}$. Therefore, 804 corresponds to a process for setting the angle to the reference beam angle $\theta_{BM}$ on bragg on a line of Lm where the brightness of the reproduction light is maximized in FIG. 11.

Figure 12A:
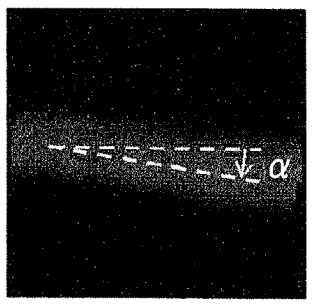
FIGS. 12A to 12D are diagrams illustrating examples of an image of reproduction light on a light detector.
Figure 12B:
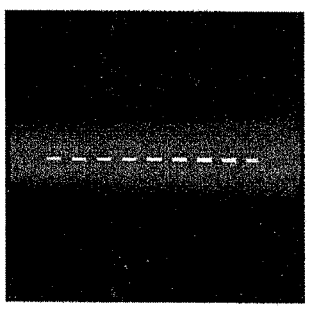
Figure 12C:
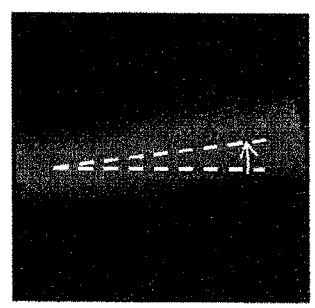

FIGS. 12A, 12B and 12C illustrate examples of reproduction images on the light detector 225 at points a, b, and c on the line of Lm in FIG. 11, in which a portion having high brightness becomes linear (bright line). Here, at the point b where the angle becomes the optimal reference beam angle $\theta_{BO}$ on bragg and the wavelength becomes the optimal reference beam wavelength $\lambda_O$, the original reproduction image is reproduced in a circular shape. However, the reproduction image becomes a horizontal bright line, as illustrated in FIG. 12B. This is because the reference beam angle on pitch direction is intentionally deviated by the process 801 of FIG. 8. In addition, at the points a and c where the reference beam angle on bragg and the reference beam wavelength are deviated from an optimal state, as illustrated in FIGS. 12A and 12C, the bright line is inclined as compared with the bright line of the optimal state. In addition, the polarity of the bright line angle $\alpha$ is different according to a direction deviated from the optimal state (point b) illustrated in FIG. 11. In addition, the magnitude of the bright line angle $\alpha$ corresponds to the deviation amounts from the optimal values of the reference beam angle on bragg and the reference beam wavelength. From this, when the reference beam angle on pitch direction is intentionally deviated, the deviation amounts from the optimal values of the reference beam angle on bragg and the reference beam wavelength and the directions thereof can be detected from the bright line angle of the reproduction image.

Figure 12D:
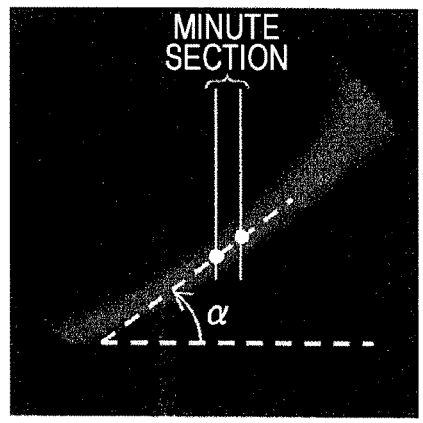

Here, if the deviation amounts from the optimal values of the reference beam angle on bragg and the reference beam wavelength are set to $\Delta\theta_{BE}$ and $\Delta\lambda_E$, the bright line detected by the light detector 225 may become a circular arc and have curvature, in the case in which deviation amounts of $\Delta\theta_{BE}$ and $\Delta\lambda_E$ are large in particular. This aspect is illustrated in FIG. 12D. When the bright line becomes a circular arc, a minute section on the bright line may be focused on and an inclination of a tangent line in the minute section may be taken. In addition, a position of the minute section to calculate the inclination of the bright line angle is preferably at almost a center portion of the reproduction image. This is because the thickness of the bright line is likely to change in the vicinity of an end of the reproduction image and a detection error is likely to be generated when the bright line inclination is calculated at the end.

Figure 13:
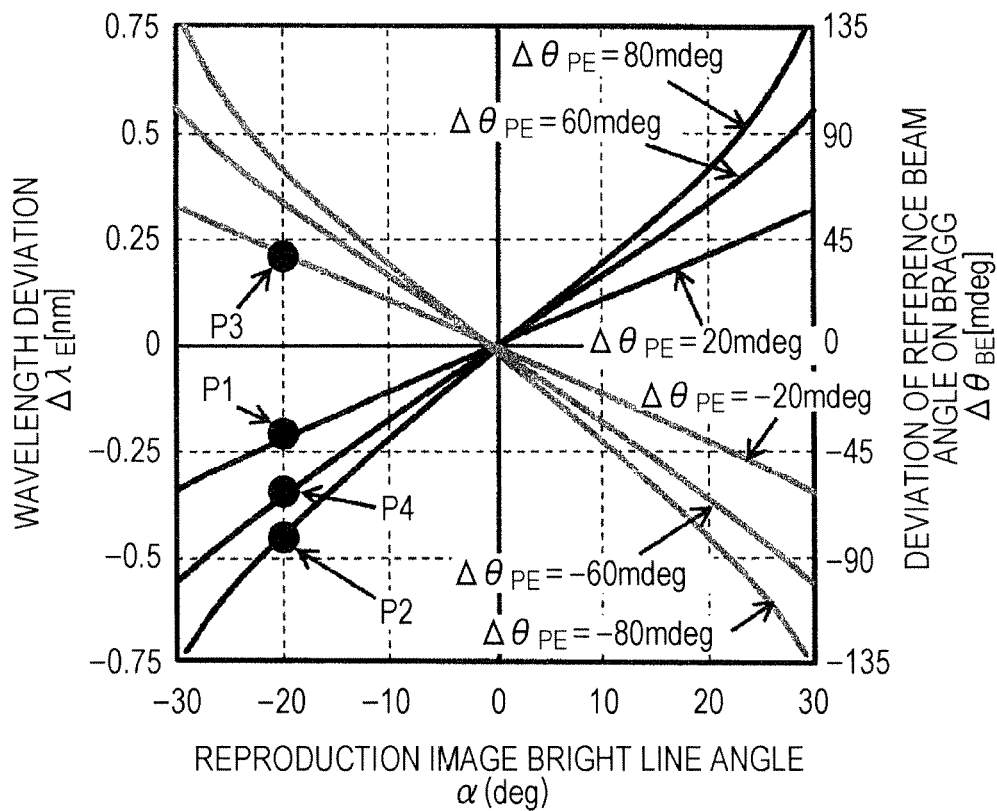
FIG. 13 is an exemplary graph illustrating a relation of a bright line angle and a deviation of a reference beam angle on bragg and a deviation of a reference beam wavelength.

FIG. 13 illustrates an example of a relation of the bright line angle $\alpha$ and the deviation amounts $\Delta\theta_{BE}$ and $\Delta\lambda_E$ from the optimal values of the reference beam angle on bragg and the reference beam wavelength. Here, the relation of the bright line angle $\alpha$ and the deviation amounts $\Delta\theta_{BE}$ and $\Delta\lambda_E$ from the optimal values of the reference beam angle on bragg and the reference beam wavelength depends on a deviation $\Delta\theta_{PE}$ of the angle on pitch direction.

For example, when the deviation $\Delta\theta_{PE}$ of the angle on pitch direction detected by 803 is 20 [mdeg] and the bright line angle $\alpha$ of the reproduction image detected by 805 is −20 [deg] (point P1), the deviation amounts from the optimal values of the reference beam angle on bragg and the reference beam wavelength become $\Delta\theta_{BE}$=−40 [mdeg] and $\Delta\lambda_E$=−0.2 [nm], respectively. Meanwhile, when the deviation $\Delta\theta_{PE}$ of the angle on pitch direction detected by 803 is 80 [mdeg] and the bright line angle $\alpha$ of the reproduction image detected by 805 is −20 [deg] (point P2), the deviation amounts from the optimal values of the reference beam angle on bragg and the reference beam wavelength become $\Delta\theta_{BE}$=−80 [mdeg] and $\Delta\lambda_E$=−0.4 [nm], respectively. In addition, at the point P3 at which the polarity of the deviation $\theta\Delta_{PE}$ of the angle on pitch direction is opposite to that at the point P1 and the reproduction image bright line angle $\alpha$ is the same as that at the point P1, the polarities of the deviation amounts from the optimal values of the reference beam angle on bragg and the reference beam wavelength are opposite to those at the point P1 and the deviation amounts from the optimal values of the reference beam angle on bragg and the reference beam wavelength become $\Delta\theta_{BE}$=40 [mdeg] and $\Delta\lambda_E$=0.2 [nm], respectively.

Therefore, the relation of the bright line angle $\alpha$ and the deviation amounts $\Delta\theta_{BE}$ and $\Delta\lambda_E$ from the optimal values of the reference beam angle on bragg and the reference beam wavelength, corresponding to the deviation $\Delta\theta_{PE}$ of the angle on pitch direction, is previously stored in the storage unit 26 and the deviation amounts from the optimal values of the reference beam angle on bragg and the reference beam wavelength can be calculated from the deviation $\Delta\theta_{PE}$ of the angle on pitch direction detected by 803 and the bright line angle $\alpha$ of the reproduction image detected by 805.

Here, because the polarities of the bright line angle $\alpha$ and the deviation amounts $\Delta\theta_{BE}$ and $\Delta\lambda_E$ from the optimal values of the reference beam angle on bragg and the reference beam wavelength are changed according to the polarity of the deviation $\Delta\theta_{PE}$ of the angle on pitch direction, a relation of the bright line angle $\alpha$ and the deviation amounts $\Delta\theta_{BE}$ and $\Delta\lambda_E$ from the optimal values of the reference beam angle on bragg and the reference beam wavelength, corresponding to the positive polarity of the deviation $\Delta\theta_{PE}$, is stored. With respect to the deviation $\Delta\theta_{PE}$ of the negative polarity, the polarities of $\Delta\theta_{BE}$ and $\Delta\lambda_E$ stored for the positive polarity may be inverted, thereby decreasing an amount of data to be stored.

In addition, the deviation $\Delta\theta_{PE}$ of the angle on pitch direction and the bright line angle $\alpha$ [deg] may be thinned out and stored and a supplementary process may be executed according to the deviation $\Delta\theta_{PE}$ of the angle on pitch direction and the bright line angle $\alpha$ of the reproduction image, which have been detected. For example, deviation amounts $\Delta\theta_{BE(60)}$ and $\Delta\lambda_{E(60)}$ from optimal conditions of a reference beam angle on bragg and a reference beam wavelength in the deviation $\Delta\theta_{PE}$=60 [mdeg] of the angle on pitch direction and the bright line angle α=−20[deg] of the reproduction image, which are illustrated at the point P4 of FIG. 13, can be calculated from data of deviation amounts $\Delta\theta_{BE(20)}$, $\Delta\lambda_{E(20)}$, $\Delta\theta_{BE(80)}$, and $\Delta\lambda_{E(80)}$ from optimal values of a reference beam angle on bragg and a reference beam wavelength at $\Delta\theta_{PE}$=20 [mdeg] and $\Delta\theta_{PE}$=80 [mdeg] as follows.

$$\Delta\theta_{BE(60)}=\Delta\theta_{BE(20)}+(\Delta\theta_{BE(80)}-\Delta\theta_{BE(20)})\cdot(60-20)/(80-20)=-40+(-80+40)\cdot 40/60=-67 \text{ [mdeg]} \quad \text{(Mathematical Formula 1)}$$

$$\Delta\lambda_{E(60)}=\Delta\lambda_{E(20)}+(\Delta\lambda_{E(80)}-\Delta\lambda_{E(20)})\cdot(60-20)/(80-20)=-0.2+(-0.4+0.2)\cdot 40/60=-0.33 \text{ [nm]} \quad \text{(Mathematical Formula 2)}$$

In the above process, the deviation amounts from the optimal values of the reference beam angle on bragg and the reference beam wavelength are detected, so that the reference beam wavelength is changed at one time with respect to the method to change the reference beam wavelength several times to converge the reference beam wavelength to the optimal value, as in the feedback control. Therefore, the reference beam angle on bragg and the reference beam wavelength can be adjusted in short time.

Second Embodiment

In this embodiment, the case in which the position of the bright line of the reproduction image is detected in the reproduction image processing unit 23 illustrated in FIG. 1 will be described.

The reproduction image processing unit 23 in FIG. 1 outputs the detection result corresponding to the position of the bright line of the reproduction image on the light detector to the controller unit 16 and the controller unit 16 performs detection of the deviation of the incidence angle of the reference beam on the optical information recording medium 1 and detection of the deviation of the wavelength of the reference beam, on the basis of the brightness and the bright line position of the reproduction light. The controller unit 16 controls the angle correcting element 219 and the galvano-mirror 220 provided in the optical pickup 11 through the reference beam angle control unit 25 to adjust the incidence angle of the reference beam on the optical information recording medium 1 and adjusts the wavelength of the light source 201 of the reference beam mounted to the optical pickup 11 through the light source control unit 21.

Figure 14:
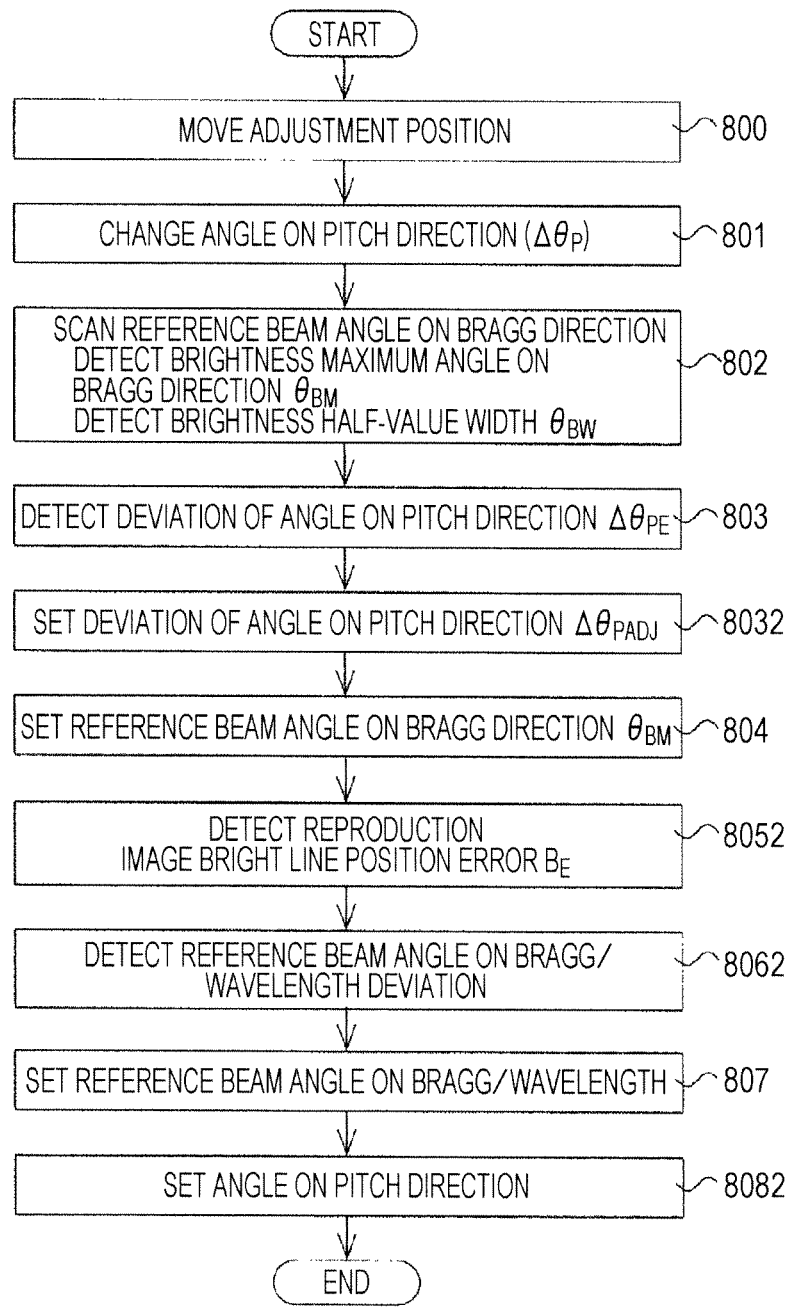
FIG. 14 is a flowchart illustrating an example of a reference beam angle and wavelength adjustment process in a second embodiment.

FIG. 14 illustrates an example of a flowchart of an adjustment process of an angle of a reference beam and a wavelength of the reference beam in a second embodiment. The same processes as those in the flowchart of FIG. 8 are denoted with the same reference numerals and explanation thereof is omitted.

In FIG. 14, in 8032, the angle correcting element 219 is controlled according to a command from the controller unit 16 to the reference beam angle control unit 25, on the basis of the deviation $\Delta\theta_{PE}$ of the angle on pitch direction detected by 803, and an angle $\theta_P$ on pitch direction in the reference beam incident on the optical information recording medium 1 is set to a predetermined angle $\Delta\theta_{PADJ}$.

In 804, the galvano-mirror 220 is controlled according to the command from the controller unit 16 to the reference beam angle control unit 25 and an angle $\theta_B$ on bragg direction in the reference beam incident on the optical information recording medium 1 is set to an angle $\theta_{BM}$ at which the brightness of the reproduction light is maximized, detected by 802.

In 8052, a position error $B_E$ of the bright line of the reproduction image is detected on the basis of an output of the reproduction image processing unit 23.

In 8062, deviation amounts from optimal values of the reference beam angle on bragg and the reference beam wavelength are calculated from the position error $B_E$ of the bright line of the reproduction image detected by 8052.

In 807, the galvano-mirror 220 and the light source 201 are controlled according to commands from the controller unit 16 to the reference beam angle control unit 25 and the light source control unit 21 and the reference beam angle on bragg and the reference beam wavelength are set to correct the deviation amounts $\Delta\theta_{BE}$ and $\Delta\lambda_E$ from the optimal values of the reference beam angle on bragg and the reference beam wavelength, calculated by 8062.

In 8082, the angle correcting element 219 is controlled according to the command from the controller unit 16 to the reference beam angle control unit 25, the angle on pitch direction is set to correct the deviation $\Delta\theta_{PADJ}$ of the angle on pitch direction, set by 8032, and the adjustment process ends.

By the above process, the reference beam angle on pitch direction, the reference beam angle on bragg direction, and the reference beam wavelength are set in a state in which information can be reproduced.

Next, a method of detecting the bright line position error $B_E$ in 8052 and a method of calculating deviation amounts from optimal values of the reference beam angle on bragg and the reference beam wavelength from the bright line position error $B_E$ in 8062 will be described.

FIGS. 15A, 15B and 15C illustrate examples of images of the reproduction light on the light detector 225 at the points a, b, and c on the line of Lm in FIG. 11, in which a portion having high brightness becomes linear (bright line). L0 and L1 illustrate brightness scanning lines to scan brightness in any direction with respect to the reproduction image detected in the light detector 225, which scan the brightness in a direction (in the drawings, a downward direction) orthogonal to the bright line at the point b at which the optimal reference beam angle on bragg is $\theta_{BO}$ and the optimal reference beam wavelength is $\lambda_O$. FIGS. 16A to 16C illustrate a relation of each element position (each pixel position in the case of an imaging element) of the light detector positioned at the brightness scanning lines L0 and L1 and brightness and X0 and X1 illustrate element positions at which the brightness is maximized in the brightness scanning lines L0 and L1. Here, the bright line position error $B_E$ is defined by the following expression.

$$B_E = X0 - X1 \quad \text{(Mathematical Formula 3)}$$

At this time, at the point b at which the optimal reference beam angle on bragg is $\theta_{BO}$ and the optimal reference beam wavelength is $\lambda_O$, the bright line position error $B_E$ becomes almost 0. Meanwhile, at the points a and c at which the reference beam angle on bragg and the reference beam wavelength are deviated from the optimal states, the polarity of the bright line position error $B_E$ is different according to a deviation direction. In addition, the magnitude of the bright line position error $B_E$ corresponds to the deviation amounts from the optimal values of the reference beam angle on bragg and the reference beam wavelength. From this, the deviation amounts from the optimal values of the reference beam angle on bragg and the reference beam wavelength and the directions thereof can be detected from the bright line position error $B_E$ of the reproduction image.

When the light detector is arranged to rotate around an optical axis, the scanning direction of the brightness scanning line is not orthogonal to the bright line direction at the point b at which the optimal reference beam angle on bragg is $\theta_{BO}$ and the optimal reference beam wavelength is $\lambda_O$. In this case, the scanning direction of the brightness scanning line may be defined according to a rotation angle around the optical axis, on the basis of the bright line direction of the reproduction image at the point b.

Figure 17:
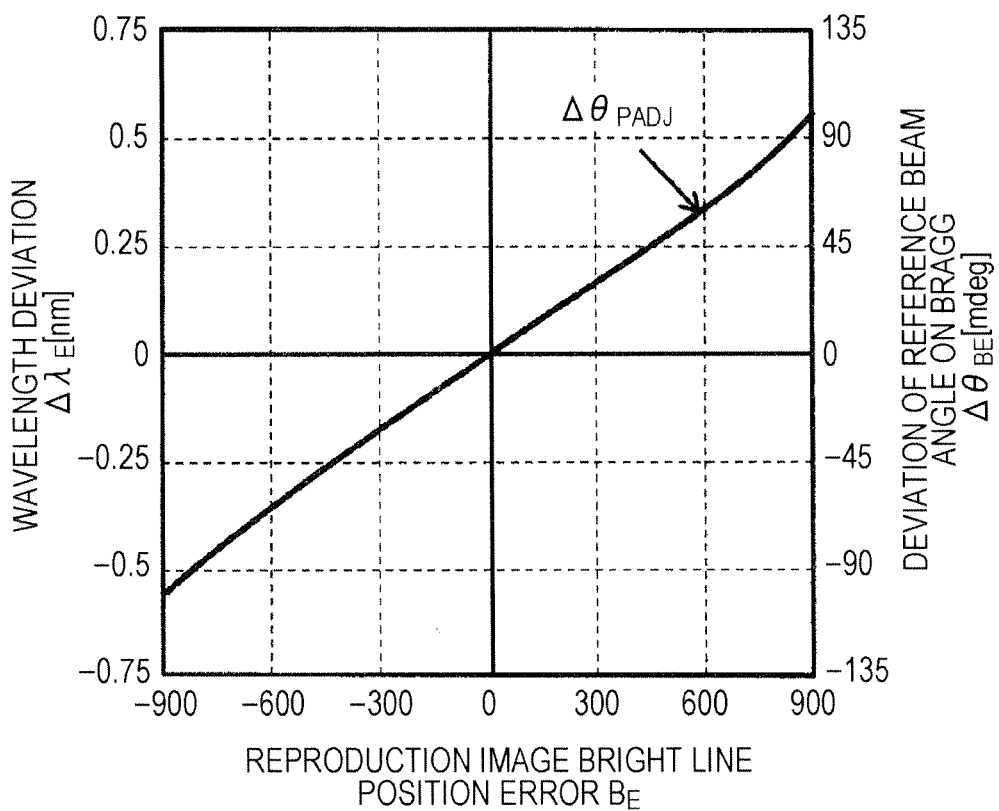
FIG. 17 is an exemplary graph illustrating a relation of a bright line position error and a deviation of a reference beam angle on bragg and a deviation of a reference beam wavelength.

FIG. 17 illustrates an example of a relation of the bright line position error $B_E$ and the deviation amounts $\Delta\theta_{BE}$ and $\Delta\lambda_E$ from the optimal values of the reference beam angle on bragg and the reference beam wavelength. Here, because the deviation $\Delta\theta_{PE}$ of the angle on pitch direction is set to the predetermined angle $\Delta\theta_{PADJ}$ in 8032, the bright line position error $B_E$ and the deviation amounts $\Delta\theta_{BE}$ and $\Delta\lambda_E$ from the optimal values of the reference beam angle on bragg and the reference beam wavelength, corresponding to $\Delta\theta_{PADJ}$, can be detected.

In the above process, because the angle is set to the predetermined angle $\Delta\theta_{PADJ}$ in 8032, only the relation of the bright line position error $B_E$ and the deviation amounts $\Delta\theta_{BE}$ and $\Delta\lambda_E$ from the optimal values of the reference beam angle on bragg and the reference beam wavelength, corresponding to $\Delta\theta_{PADJ}$, may be stored and an amount of data to be stored can be decreased. In addition, data of a minimum of two brightness scanning lines is read only when the deviation amounts $\Delta\theta_{BE}$ and $\Delta\lambda_E$ from the optimal values of the reference beam angle on bragg and the reference beam wavelength are detected and it is not necessary to read data of all scanning lines of the light detector. Therefore, a processing time can be greatly decreased.

Figure 18A:
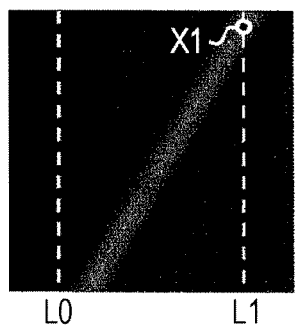
FIGS. 18A to 18D are diagrams illustrating examples of a relation of a reproduction image on a light detector and a brightness scanning line position.
Figure 18B:
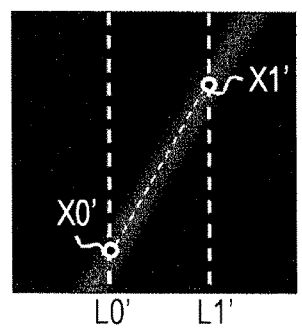
Figure 18C:
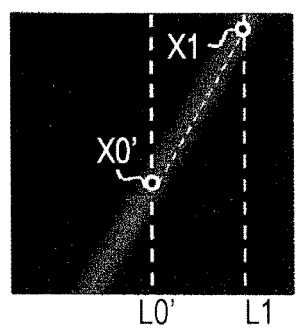
Figure 18D:
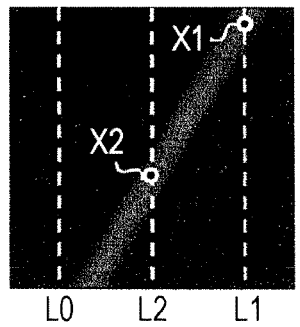

The position of the brightness scanning line is not limited to the position of FIG. 15 and various setting can be performed. In addition, as illustrated in FIG. 18A, when a position at which the brightness is maximized cannot be detected at a brightness scanning line of L0, a scanning position may be changed to L0' and L1' by a retry process as illustrated in FIG. 18B and positions X0' and X1' at which the brightness is maximized may be calculated. Alternatively, as illustrated in FIG. 18C, the scanning position of L0 may be changed to L0' and the position X0' at which the brightness is maximized may be calculated. Alternatively, as illustrated in FIG. 18D, positions at which the brightness is maximized may be calculated with respect to data of three brightness scanning lines of L0, L1, and L2. When the position at which the brightness of L0 or L1 is maximized cannot be detected, the bright line position error may be calculated from X1 corresponding to the brightness scanning line in which the position at which the brightness is maximized has been detected and X2 corresponding to the brightness scanning line of L2. In this case, a ratio m decreased from the interval of the original brightness scanning lines is multiplied with 1/m of the bright line position error $B_E$. For example, in FIG. 18B, when the interval of the brightness scanning lines is set to ½, $B_E$ becomes $B_E=2'$ (X0'−X1').

Figure 19:
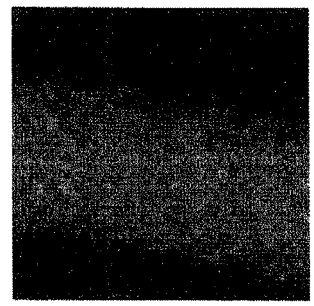
FIG. 19 is an exemplary enlarged view of a bright line portion in a reproduction image on a light detector.

In addition, an enlargement example of the bright line portion is illustrated in FIG. 19. By an influence of light and dark of recorded two-dimensional data, brightness irregularities occur. Therefore, at the time of adjustment, it is preferable to use a page in which data where almost an entire surface of a reproduction image after the adjustment becomes white has been recorded. Alternatively, filtering such as a moving average may be performed on the taken brightness scanning line data to decrease the influence of the light and dark of the recorded two-dimensional data. In addition, an average may be calculated for a plurality of brightness scanning lines adjacent to each other. Alternatively, after the average is calculated for the plurality of brightness scanning lines adjacent to each other, a filter process by the moving average may be executed in a brightness scanning line direction.

Figure 20:
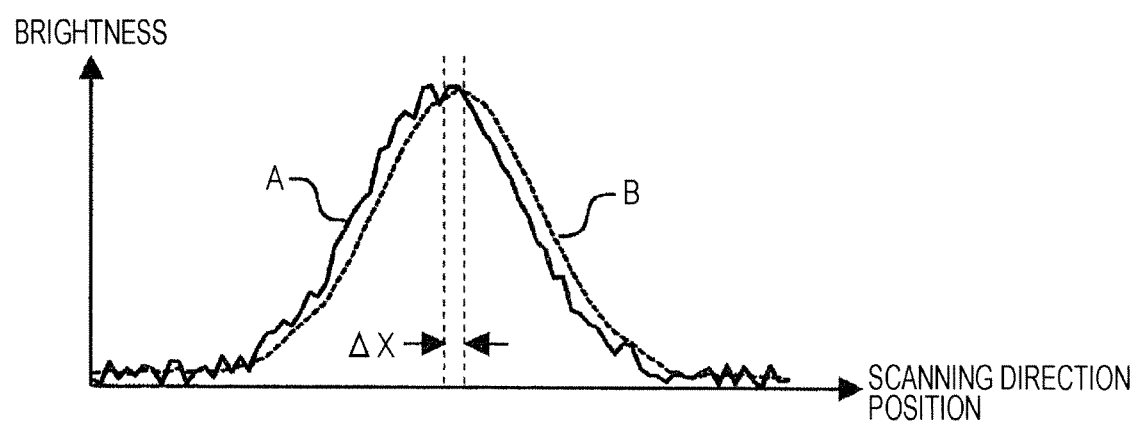
FIG. 20 is a diagram illustrating an example of a moving average process in scanning direction data.

FIG. 20 illustrates an example of the case in which a filter process by the moving average is executed with respect to data of the brightness scanning line taken from the reproduction image where the brightness irregularities occur, in a scanning direction. FIG. 20 illustrates data in the vicinity of a portion where the brightness is maximized. In FIG. 20, A illustrates taken original brightness scanning line data and B illustrates data on which the moving average process has been executed. In the original data A, a variation by the brightness irregularities increases and in the data B after the moving average, the variation decreases. Thereby, detection precision of the position at which the brightness is maximized can be improved. Here, the position at which the brightness is maximized is deviated by $\Delta X$ by the moving average process. However, the same process is executed on the brightness scanning lines L0 and L1 taken to calculate the bright line position error $B_E$, so that the position at which the brightness is maximized is deviated by the same value, which results in not affecting the bright line position error $B_E$.

Instead of using all data of the taken brightness scanning lines, the data may be thinned out and the process may be executed.

Third Embodiment

Figure 21:
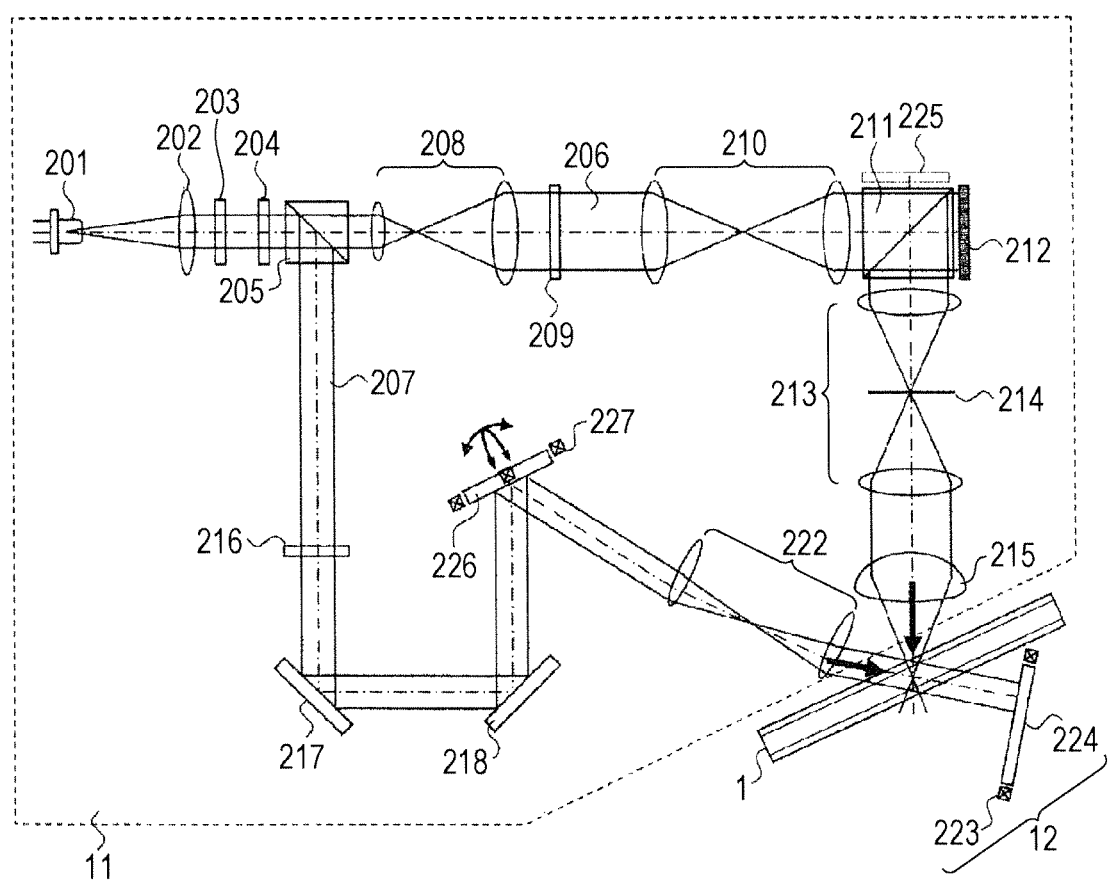
FIG. 21 is a block diagram illustrating a configuration example of an optical information reproducing device according to a third embodiment.

FIG. 21 is a block diagram illustrating a configuration example of a pickup 11 in an optical information recording/reproducing device 10 according to a third embodiment. In FIG. 21, the same functional portions as those in the configuration example of FIG. 2 are denoted with the same reference numerals and explanation thereof is omitted.

In FIG. 21, a two-dimensional galvano-mirror 226 can adjust two axes of a reference beam incidence angle $\theta_B$ on bragg direction and a reference beam incidence angle $\theta_P$ on pitch direction by a two-dimensional actuator 227. By using this optical system configuration, the angle correcting element 219 and the galvano-mirror 220 illustrated in FIG. 2 can be integrated with each other and a size of the optical system can be decreased. If the optical system illustrated in FIG. 21 is controlled according to the flowchart illustrated in FIG. 8 or 14, the reference beam angle on pitch direction, the reference beam angle on bragg direction, and the reference beam wavelength can be adjusted to optimal values.

Fourth Embodiment

In this embodiment, the case in which the reproduction image processing unit 23 in FIG. 1 detects a bright line width Wd in addition to the bright line angle of the reproduction image will be described as a modification of the first and second embodiments.

The reproduction image processing unit 23 in FIG. 1 outputs the detection result corresponding to the bright line width Wd of the reproduction image on the light detector to the controller unit 16 and the controller unit 16 performs detection of the deviation of the incidence angle of the reference beam on the optical information recording medium 1 and detection of the deviation of the wavelength of the reference beam, on the basis of the brightness and the bright line position of the reproduction light. The controller unit 16 controls the angle correcting element 219 and the galvano-mirror 220 provided in the optical pickup 11 through the reference beam angle control unit 25 to adjust the incidence angle of the reference beam on the optical information recording medium 1 and adjusts the wavelength of the light source 201 of the reference beam mounted to the optical pickup 11 through the light source control unit 21.

Figure 22:
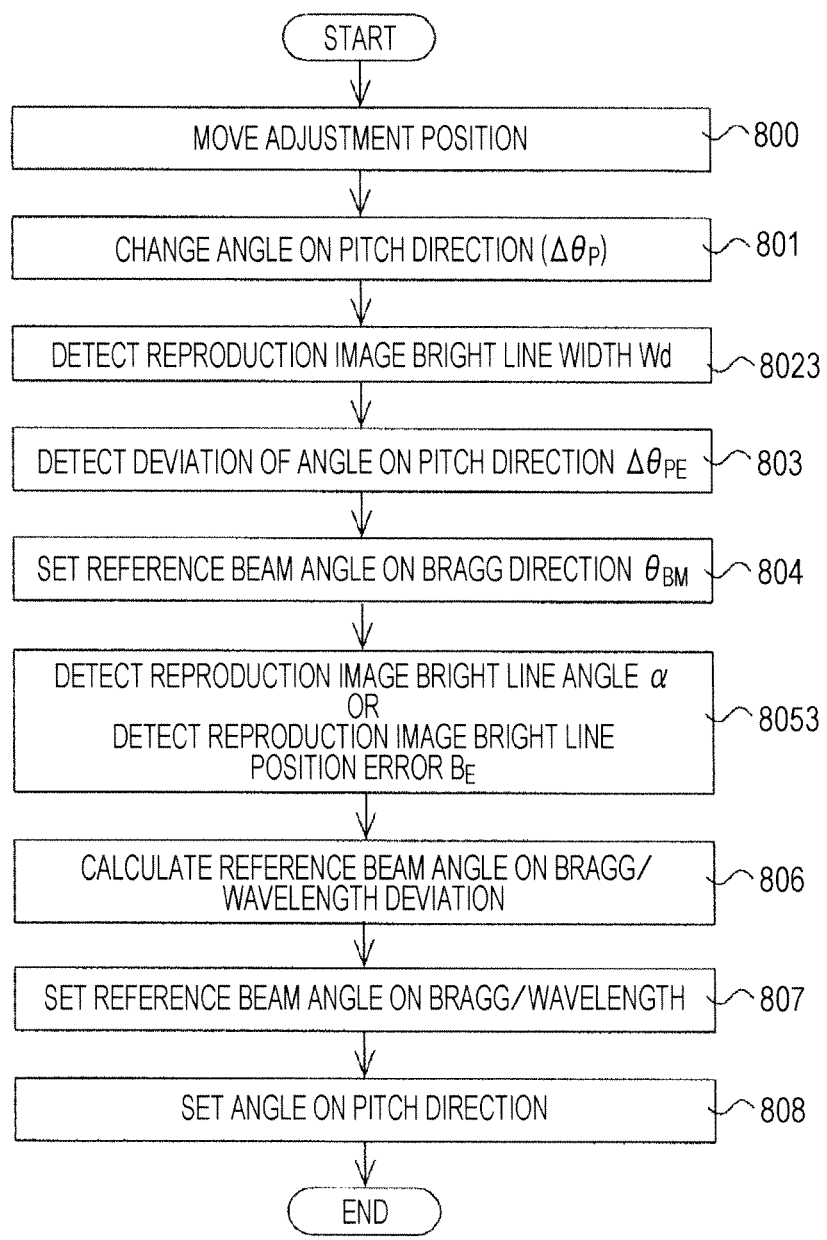
FIG. 22 is a flowchart illustrating an example of a reference beam angle and wavelength adjustment process in a fourth embodiment.

FIG. 22 is a flowchart illustrating a form different from the forms of FIGS. 8 and 14 described above. Portions of the same processes as those of FIGS. 8 and 14 are denoted with the same reference numerals and explanation thereof is omitted. Because a process 8053 of FIG. 22 is the same as the process 805 of FIG. 8 or the process 8052 of FIG. 14, explanation thereof is omitted. In the process 8023 of FIG. 22, the reproduction image processing unit 23 detects the bright line width Wd of the reproduction image by the image process to detect the deviation $\Delta\theta_{PE}$ of the angle on pitch direction. The detail of the detection method will be described using FIGS. 23A to 24.

Figures 23A, 23B, 23C, 23D:
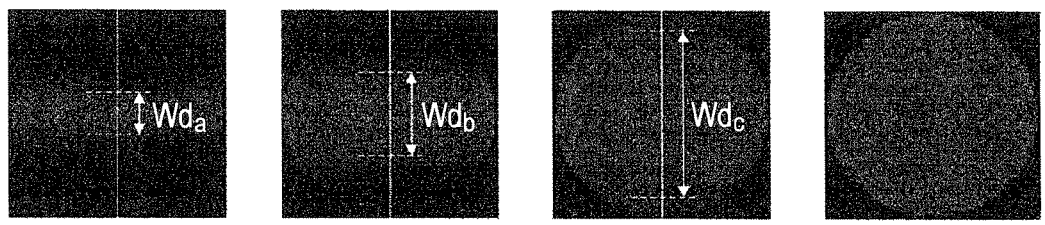
FIGS. 23A to 23D are diagrams illustrating examples of a reproduction image when a deviation of an angle on pitch direction is changed.

FIGS. 23A to 23D illustrate an aspect of a reproduction image in the case in which the deviation $\Delta\theta_{PE}$ of the angle on pitch direction is changed. FIG. 23A illustrates the case in which $\Delta\theta_{PE}$ is set to 400 mdeg, FIG. 23B illustrates the case in which $\Delta\theta_{PE}$ is set to 200 mdeg, FIG. 23C illustrates the case in which $\Delta\theta_{PE}$ is set to 100 mdeg, and FIG. 23D illustrates the case in which $\Delta\theta_{PE}$ is set to 0 mdeg and the bright line width Wd of the reproduction image decreases when $\Delta\theta_{PE}$ increases. From this, if the bright line width Wd of the reproduction image is detected, a value of the deviation $\Delta\theta_{PE}$ of the angle on pitch direction can be known.

Figure 24:
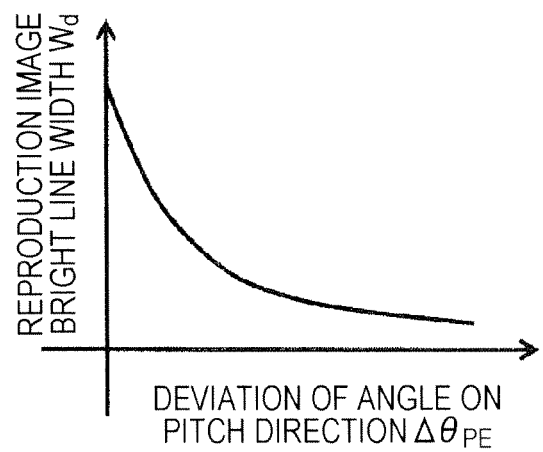
FIG. 24 is a diagram illustrating an example of a graph illustrating a relation of a deviation of an angle on pitch direction and a reproduction image bright line width.

FIG. 24 illustrates a relation of the deviation $\Delta\theta_{PE}$ of the angle on pitch direction and the reproduction image bright line width Wd. The relation of both sides becomes an inversely proportional graph and the value of the deviation $\Delta\theta_{PE}$ of the angle on pitch direction may be derived from the relation.

Different from the first and second embodiments, in this embodiment, because it is not necessary to search the reference beam angle on bragg direction, an adjustment time can be shortened by using high-speed image processing technology. In addition, in the case in which a reproduction image is obtained from angle multiple holograms, if the deviation $\Delta\theta_{PE}$ of the angle on pitch direction increases, a plurality of pages may be detected as a plurality of bright lines. Even in this case, the bright lines crossing each other are not detected on the detector in principle. For this reason, if the bright line width Wd of each bright line is detected, the deviation $\Delta\theta_{PE}$ of the angle on pitch direction can be detected.

Fifth Embodiment

In this embodiment, the case in which the optical information recording/reproducing device 10 in FIG. 1 is an optical information reproducing device that does not have a recording function and can perform only reproduction will be described as a modification of the first to fourth embodiments.

Figure 25:
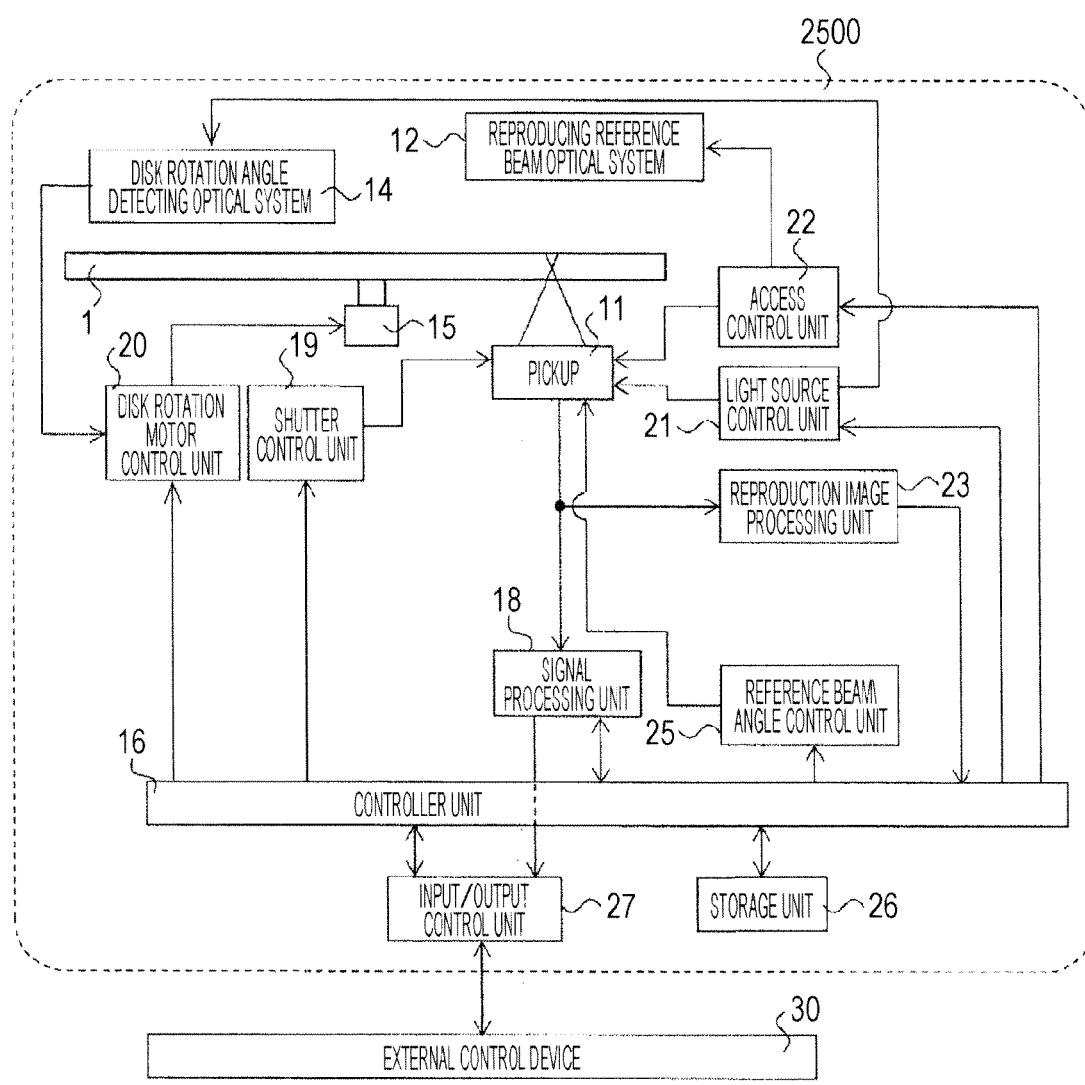
FIG. 25 is a block diagram illustrating a configuration example of an optical information reproducing device according to the present invention.

FIG. 25 is a block diagram illustrating an example of a reproducing device that reproduces digital information recorded using holography from an optical information recording medium. An optical information reproducing device 2500 has a configuration in which the cure optical system 13 and the signal generating unit 17 are removed from the optical information recording/reproducing device 10 described above and the other components are included in the optical information recording/reproducing device 10. Therefore, explanation of the detail of each portion is omitted.

In addition, the configuration of the pickup 11 included in the optical information reproducing device 2500 can be realized by removing the beam expander 208, the phase mask 209, the relay lens 210, the PBS prism 211, and the spatial light modulator 212 from the configuration of FIG. 3. Therefore, all the components of the optical information reproducing device 2500 are included in the optical information recording/reproducing device 10.

If the configuration of the optical information reproducing device 2500 according to this embodiment is used, all the reproduction operations of the operations included in the first, second, third, and fourth embodiments other than the recording operation can be executed. That is, in the device having only the reproduction function, the incidence angle of the reference beam and the wavelength of the reference beam can be adjusted by using the methods according to the first, second, third, and fourth embodiments. If the above configuration is used, a reproduction dedicated device in which the number of components is decreased can be configured. Therefore, the device can be manufactured at a low cost as compared with the configuration illustrated in FIG. 1.

In the embodiments described above, when the deviation amounts from the optimal values of the reference beam angle on bragg and the reference beam wavelength are large and the reference beam angle on bragg and the reference beam wavelength cannot be sufficiently adjusted at one time, the adjustment process may be executed two times. In addition, the example of the case in which the angle correcting element 219 is used as the mechanism for correcting the reference beam incidence angle on pitch direction has been described. However, the present invention is not limited thereto and a mechanism for changing the inclination of the pitch direction of the optical information recording medium 1 may be used. In addition, the pickup 11, the cure optical system 13, and the disk rotation angle detecting optical system 14 can be simplified by integrating some optical system configurations or all optical system configurations. In addition, in the reproduction image processing unit 23, the brightness is detected from the output of the light detector 225 to reproduce the page data. However, the present invention is not limited thereto and the reproduction light may be received by a photodiode and a signal corresponding to a total amount of light may be detected.

The present invention is not limited to the embodiments described above and various modifications are included in the present invention. For example, the embodiments are described in detail to facilitate the description of the present invention and are not limited to embodiments in which all of the described configurations are included. In addition, a part of the configurations/processes of the certain embodiment can be replaced by the configurations/processes of another embodiment or the configurations/processes of another embodiment can be added to the configurations/processes of the certain embodiment. In addition, for a part of the configurations/processes of the individual embodiments, other configurations/processes can be added, deleted, and replaced.

In addition, a part or all of the individual configurations, functions, processing units, and processing mechanisms may be designed by integrated circuits and may be realized by hardware. In addition, the individual configurations and functions may be realized by software by analyzing programs for realizing the functions by a CPU and executing the programs by the CPU. Information such as the programs for realizing the individual functions and the data may be stored in a recording device such as a memory, a hard disk, and a solid state drive (SSD).

In addition, only control lines or information lines necessary for explanation are illustrated and the control lines or information lines do not mean all control lines or information lines necessary for a product. In actuality, almost all configurations may be connected to each other.

What is claimed is:

1. An optical information reproducing device to reproduce information recorded on an optical information recording medium using interference of a signal beam and a reference beam, comprising:
   a light source that emits light to the optical information recording medium;
   a light source control unit that controls a wavelength of the light emitted from the light source;
   a reference beam angle control unit that controls an incidence angle of the reference beam to the optical information recording medium;
   a light detector that detects a reproduction image from the optical information recording medium or a brightness distribution of the reproduction image;
   a reproduction image processing unit that detects a bright line of the reproduction image on the basis of a detection result of the light detector and outputs a detection result of the bright line; and
   a control unit that controls the wavelength of the light emitted from the light source through the light source control unit, on the basis of an output of the reproduction image processing unit, and controls the incidence angle of the reference beam through the reference beam angle control unit, wherein
   the reproduction image processing unit detects an angle between bright lines formed by a bright line of the reproduction image when the incidence angle of the reference beam and the wavelength of the light source are optimal and the bright line of the detected reproduction image, and
   the control unit controls the incidence angle of the reference beam and the wavelength of the light source, on the basis of the angle between the bright lines.

2. An optical information reproducing device to reproduce information recorded on an optical information recording medium using interference of a signal beam and a reference beam, comprising:
   a light source that emits light to the optical information recording medium;
   a light source control unit that controls a wavelength of the light emitted from the light source;
   a reference beam angle control unit that controls an incidence angle of the reference beam to the optical information recording medium;
   a light detector that detects a reproduction image from the optical information recording medium or a brightness distribution of the reproduction image;
   a reproduction image processing unit that detects a bright line of the reproduction image on the basis of a detection result of the light detector and outputs a detection result of the bright line; and
   a control unit that controls the wavelength of the light emitted from the light source through the light source control unit, on the basis of an output of the reproduction image processing unit, and controls the incidence angle of the reference beam through the reference beam angle control unit, wherein
   the reproduction image processing unit detects a bright line position error to be a difference of a bright line position of the reproduction image on the light detector when the incidence angle of the reference beam and the wavelength of the light source are optimal and a bright line position of the reproduction image detected on the light detector, and
   the control unit controls the incidence angle of the reference beam and the wavelength of the light source, on the basis of the bright line position error.

3. The optical information reproducing device according to claim 2, wherein
   when lines scanning brightness in a direction orthogonal to a bright line direction of the reproduction image when the incidence angle of the reference beam and the wavelength of the light source are optimal in the reproduction image processing unit are set to brightness scanning lines, the control unit controls the incidence angle of the reference beam and the wavelength of the light source, such that the bright line of the detected reproduction image is orthogonal to the brightness scanning line.

4. The optical information reproducing device according to claim 2, wherein
   the reproduction image processing unit detects a position at which brightness in at least two scanning lines of the scanning lines is maximized.

5. The optical information reproducing device according to claim 1, wherein
   the reproduction image processing unit detects a bright line width from the detected reproduction image, and
   the control unit controls the incidence angle of the reference beam and the wavelength of the light source, on the basis of the bright line width.

6. The optical information reproducing device according to claim 2, wherein
   the reproduction image processing unit detects a bright line width from the detected reproduction image, and
   the control unit controls the incidence angle of the reference beam and the wavelength of the light source, on the basis of the bright line width.

7. A reference beam adjusting method to reproduce information recorded on an optical information recording medium using interference of a signal beam and a reference beam, comprising:
   radiating the reference beam to the optical information recording medium;
   detecting a reproduction image from the optical information recording medium and a brightness distribution of the reproduction image;
   detecting a bright line of the reproduction image, on the basis of a detection result of the reproduction image and the brightness distribution of the reproduction image;
   controlling an incidence angle and a wavelength of the reference beam, on the basis of a detection result of the bright line of the reproduction image;
   moving a radiation position of the reference beam to the optical information recording medium to a predetermined position;
   changing an incidence angle of a first direction in the reference beam to a predetermined angle; and
   setting an incidence angle of a second direction in the reference beam to an angle at which brightness of the reproduction image is maximized, wherein
   in detecting the bright line of the reproduction image, an angle between bright lines formed by a bright line of the reproduction image when the incidence angle of the second direction in the reference beam and the wavelength of the reference beam are optimal and the bright line of the detected reproduction image is detected, and
   in controlling the incidence angle and the wavelength of the reference beam, the incidence angle of the second direction in the reference beam and the wavelength of the reference beam are controlled on the basis of the angle between the bright lines.

8. The reference beam adjusting method according to claim 7, further comprising:
  changing the incidence angle of the second direction in the reference beam to a plurality of angles;
  detecting a brightness value of the reproduction image;
  detecting an incidence angle range in which the brightness value of the reproduction image becomes a predetermined value or more, among the incidence angles of the second direction in the reference beam; and
  detecting a deviation of the incidence angle of the first direction in the reference beam, wherein
  in detecting the brightness value of the reproduction image, when the incidence angle of the second direction in the reference beam is changed to the plurality of angles, a brightness value of the reproduction image corresponding to each incidence angle having been changed is detected,
  in detecting the incidence angle range in which the brightness value of the reproduction image becomes the predetermined value or more, an incidence angle range of the second direction in which the brightness value of the reproduction image becomes the predetermined value or more is detected, and
  in detecting the deviation of the incidence angle of the first direction in the reference beam, the deviation of the incidence angle of the first direction is detected on the basis of the incidence angle range of the second direction.

9. The reference beam adjusting method according to claim 7, further comprising:
  detecting a deviation of the incidence angle of the first direction in the reference beam, on the basis of the detection result of the bright line of the reproduction image, wherein
  in detecting the bright line of the reproduction image, a bright line width of the reproduction image is detected, and
  in detecting the deviation of the incidence angle of the first direction in the reference beam, the deviation of the incidence angle of the first direction in the reference beam is detected on the basis of the bright line width.

10. A reference beam adjusting method to reproduce information recorded on an optical information recording medium using interference of a signal beam and a reference beam, comprising:
  radiating the reference beam to the optical information recording medium;
  detecting a reproduction image from the optical information recording medium and a brightness distribution of the reproduction image;
  detecting a bright line of the reproduction image, on the basis of a detection result of the reproduction image and the brightness distribution of the reproduction image;
  controlling an incidence angle and a wavelength of the reference beam, on the basis of a detection result of the bright line of the reproduction image;
  moving a radiation position of the reference beam to the optical information recording medium to a predetermined position;
  changing an incidence angle of a first direction in the reference beam to a predetermined angle; and
  setting an incidence angle of a second direction in the reference beam to an angle at which the brightness of the detected reproduction image is maximized, wherein
  in detecting the bright line of the reproduction image, a bright line position error to be a difference of a bright line position of the reproduction image when the incidence angle of the second direction in the reference beam and the wavelength of the reference beam are optimal and a bright line position of the detected reproduction image is detected, and
  in controlling the incidence angle and the wavelength of the reference beam, the incidence angle of the second direction in the reference beam and the wavelength of the reference beam are controlled on the basis of the bright line position error.

11. The reference beam adjusting method according to claim 10, further comprising:
  changing the incidence angle of the second direction in the reference beam to a plurality of angles;
  detecting a brightness value of the reproduction image;
  detecting an incidence angle range in which the brightness value of the reproduction image becomes a predetermined value or more, among the incidence angles of the second direction in the reference beam; and
  detecting a deviation of the incidence angle of the first direction in the reference beam, wherein in detecting the brightness value of the reproduction image, when the incidence angle of the second direction in the reference beam is changed to the plurality of angles, a brightness value of the reproduction image corresponding to each incidence angle having been changed is detected,
  in detecting the incidence angle range in which the brightness value of the reproduction image becomes the predetermined value or more, an incidence angle range of the second direction in which the brightness value of the reproduction image becomes the predetermined value or more is detected, and
  in detecting the deviation of the incidence angle of the first direction in the reference beam, the deviation of the incidence angle of the first direction is detected on the basis of the incidence angle range of the second direction.

12. The reference beam adjusting method according to claim 10, further comprising:
  detecting the deviation of the incidence angle of the first direction in the reference beam, on the basis of the detection result of the bright line of the reproduction image, wherein
  in detecting the bright line of the reproduction image, a bright line width of the reproduction image is detected, and
  in detecting the deviation of the incidence angle of the first direction in the reference beam, a deviation of the incidence angle of the first direction in the reference beam is detected on the basis of the bright line width.

13. The reference beam adjusting method according to claim 7, wherein
  in controlling the incidence angle and the wavelength of the reference beam, the incidence angle of the second direction in the reference beam and the wavelength of the reference beam are controlled on the basis of a deviation of the incidence angle of the first direction in the reference beam and the angle between the bright lines or the bright line position error.

* * * * *